(12) United States Patent
Theis

(10) Patent No.: US 12,425,043 B2
(45) Date of Patent: Sep. 23, 2025

(54) LOSSY COMPRESSION WITH GAUSSIAN DIFFUSION

(71) Applicant: Google LLC, Mountain View, CA (US)

(72) Inventor: Lucas Theis, London (GB)

(73) Assignee: Google LLC, Mountain View, CA (US)

( * ) Notice: Subject to any disclaimer, the term of this patent is extended or adjusted under 35 U.S.C. 154(b) by 320 days.

(21) Appl. No.: 18/320,155

(22) Filed: May 18, 2023

(65) Prior Publication Data

US 2023/0378975 A1 Nov. 23, 2023

Related U.S. Application Data

(60) Provisional application No. 63/365,013, filed on May 19, 2022.

(51) Int. Cl.
*H03M 13/00* (2006.01)
*H03M 7/30* (2006.01)

(52) U.S. Cl.
CPC .................................. *H03M 7/3059* (2013.01)

(58) Field of Classification Search
CPC .............................. H03M 7/3059; H03M 7/00
USPC ........................................................... 341/94
See application file for complete search history.

(56) References Cited

U.S. PATENT DOCUMENTS

| | | | | |
|---|---|---|---|---|
| 2019/0036550 | A1* | 1/2019 | Koike-Akino | H03M 13/2906 |
| 2023/0083502 | A1* | 3/2023 | Imani | H04L 1/0045 |
| | | | | 714/758 |

OTHER PUBLICATIONS

Agustsson et al., "Universally Quantized Neural Compression," In advances in Neural Information Processing Systems 33, 2020, 10 pages.
Agustsson et al., "Generative Adversarial Networks for Extreme Learned Image Compression," In Proceedings of the IEEE International Conference on Computer Vision, 2019, pp. 221-231.
Alemi et al., "Fixing a Broken ELBO," Proceedings of the 35th International Conference on Machine Learning, PMLR, 2018, pp. 159-168.
Al-Shaykh et al., "Lossy Compression of Noisy Images," IEEE Transactions on Image Processing, Dec. 1988, pp. 1641-1652, vol. 7, No. 12.

(Continued)

*Primary Examiner* — Jean B Jeanglaude
(74) *Attorney, Agent, or Firm* — McDonnell Boehnen Hulbert & Berghoff LLP

(57) ABSTRACT

A method of encoding data includes determining, by an encoder, a first data instance by corrupting the data with Gaussian noise. The method also includes determining, by the encoder, information representative of one or more conditional distributions. The method additionally includes determining, by the encoder, an index of a corrupted data instance of the sequence of progressively less corrupted data instances. The index corresponds with a conditional distribution of the one or more conditional distributions which causes the corrupted data instance to have a desired bit-rate. The method further includes transmitting, from the encoder to a decoder, the first data instance and the information representative of the one or more conditional distributions to enable the decoder to recover the corrupted data instance having the desired bit-rate and use the corrupted data instance to generate output data representative of the data.

20 Claims, 10 Drawing Sheets

(56) References Cited

OTHER PUBLICATIONS

Ballé et al., "End-to-end Optimized Image Compression," In International Conference on Learning Representations, arXiv:1611.01704v3, Mar. 3, 2017, 27 pages.
Ballé et al., "Nonlinear Transform Coding," IEEE Journal of Selected Topics in Signal Processing, doi:10.1109/JSTSP.2020.3034501, 2021, pp. 339-353, vol. 15, No. 2.
Bellard, Fabrice, "BPG Image format," https://bellard.org/bpg/, 2018, 2 pages.
Bennett et al., "Entanglement-Assisted Capacity of a Quantum Channel and the Reverse Shannon Theorem," arXiv:quant-ph/0106052v2 (May 14, 2002), IEEE Trans. Info. Theory, 2002, 42 pages, vol. 48, No. 10.
Blau et al., "Rethinking Lossy Compression: The Rate-Distortion-Perception Tradeoff," arXiv:1901.07821v4 (Jul. 30, 2019), In International Conference on Machine Learning, 2019, 21 pages.
Blau et al., "The Perception-Distortion Tradeoff," arXiv:1711.066077v4 (Oct. 25, 2020), In IEEE/CVF Conference on Computer Vision and Pattern Recognition, 2018, pp. 6228-6237.
Brekelmans et al., "Exact Rate-Distortion in Autoencoders via Echo Noise," 33rd Conference on Neural Information Processing Systems, 2019, 12 pages.
Cover et al., Elements of Information Theory 2nd Edition (Wiley Series in Telecommunications and Signal Processing). Wiley, 2006. p. 1-275.
Cover et al., Elements of Information Theory 2nd Edition (Wiley Series in Telecommunications and Signal Processing). Wiley, 2006. p. 276-564.
Dhariwal et al., "Diffusion Models Beat GANs on Image Synthesis," 35th Conference on Neural Information Processing Systems, 2021, 15 pages.
Dockhorn et al., "Score-Based Generative Modeling with Critically-Damped Langevin Diffusion," arXiv:2112.07068v4 (Mar. 25, 2022), International Conference on Learning Representations (ICLR), 2022, 54 pages.
Fei-Fei et al.. Construction and Analysis of a Large Scale Image Ontology. Vision Sciences Society, 2009, 1 page.
Flamich et al., "Compressing Images by Encoding Their Latent Representations with Relative Entropy Coding," 34th Conference on Neural Information Processing Systems, 2020, 11 pages.
Flamich et al., "Fast Relative Entropy Coding with A* coding," arXiv:2201.12857v2, Jun. 19, 2022, 30 pages.
Galić et al., "Image Compression with Anisotropic Diffusion," Journal of Mathematical Imaging and Vision, Jul. 2008, pp. 255-269, vol. 31, No. 2.
Gao et al., "Perceptual learned image compression with continuous rate adaptation," In 4th Challenge on Learned Image Compression, Jun. 2021, 5 pages.
Goodfellow et al., "Generative Adversarial Nets," In Advances in Neural Information Processing Systems, 2014, pp. 2672-2680.
Gu et al., "Vector Quantized Diffusion Model for Text-to-Image Synthesis," rint arXiv:2111.14822v3, Mar. 3, 2022, 14 pages.
Havasi et al., "Minimal Random Code Learning: Getting Bits Back from Compressed Model Parameters," In International Conference on Learning Representations, 2019, 4 pages.
Heusel et al., "GANs Trained by a Two Time-Scale Update Rule Converge to a Local Nash Equilibrium," 31st Conference on Neural Information Processing Systems, 2017, pp. 6626-6637.
Ho et al., "Cascaded Diffusion Models for High Fidelity Image Generation," Journal of Machine Learning Research, 2022, pp. 1-33, vol. 23, No. 47.
Ho et al., "Denoising Diffusion Probabilistic Models," 34th Conference on Neural Information Processing Systems, 2020, pp. 6840-6851, vol. 33.
Jolicoeur-Martineau et al., Gotta Go Fast When Generating Data with Score-Based Models, arXiv:2105.14080v1, May 28, 2021, 24 pages.

Kim et al., "DiffusionCLIP: Text-Guided Diffusion Models for Robust Image Manipulation," arXiv:2110.02711v6, Aug. 11, 2022, 28 pages.
Kingma et al., "Auto-Encoding Variational Bayes," arXiv:1312.6114v11, Dec. 10, 2022, 14 pages.
Kingma et al., "Variational Diffusion Models," 35th Conference on Neural Information Processing Systems, 2021, 12 pages.
Kolesnikov et al., "Big Transfer (BiT): General Visual Representation Learning," arXiv:1912.11370v3, May 5, 2020, 28 pages.
Kolouri et al., "Generalized Sliced Wasserstein Distances," 33rd Conference on Neural Information Processing Systems, 2019, 12 pages.
Kong et al., "On Fast Sampling of Diffusion Probabilistic Models," arXiv:2106.00132v2, Jun. 23, 2021, 21 pages.
Li et al., Strong Functional Representation Lemma and Applications to Coding Theorems. IEEE Transactions on Information Theory, 2017, pp. 589-593.
Lytchier et al., "Perceptually-Guided Lossy Image Composition," In 4th Challenge on Learned Image Compression, Jun. 2021, 4 pages.
Maddison, Chris J., "A Poisson process model for Monte Carlo," arXiv:1602.05986v2, Apr. 12, 2016, 37 pages.
Maoutsa et al., "Interacting Particle Solutions of Fokker-Planck Equations Through Gradient-Log-Density Estimation," Entropy, 2020, 35 pages, vol. 22.
Mentzer et al., "High-Fidelity Generative Image Compression," 34th Conference on Neural Information Processing Systems, 2020, 12 pages.
Nichol et al., GLIDE: Towards Photorealistic Image Generation and Editing with Text-Guided Diffusion Models, arXiv:2112.10741V3, Mar. 8, 2022, 20 pages.
Pandey et al., "DiffuseVAE: Efficient, Controllable and High-Fidelity Generation from Low-Dimensional Latents," arXiv:2201.00308v3, Nov. 29, 2022, 39 pages.
Ramesh et al., "Hierarchical Text-Conditional Image Generation with Clip Latents," arXiv:2204.06125v1, Apr. 13, 2022, 27 pages.
Rezende et al., "Stochastic Backpropagation and Approximate Inference in Deep Generative Models," arXiv:1401.4082v3, In International Conference on Machine Learning, May 20, 2014, 14 pages.
Robbins, Herbert, "An Empirical Bayes Approach to Statistics," In Proceedings of the Third Berkeley Symposium on Mathematical Statistics and Probability, 1956, pp. 157-163, vol. 1.
Roberts, Lawrence Gilman, "Picture Coding Using Pseudo-Random Noise," IRE Transactions on Information Theory, 1962, pp. 145-154, vol. 8, No. 2.
Rombach et al,. "High-Resolution Image Synthesis with Latent Diffusion Models," arXiv:2112.10752v2, Apr. 13, 2022, 45 pages.
Saharia et al., "Palette: Image-to-Image Diffusion Models," arXiv:2111.05826v2, May 3, 2022, 29 pages.
Salimans et al., "Progressive Distillation for Fast Sampling of Diffusion Models," In International Conference on Learning Representations, 2022, 21 pages.
Shannon, Claude E., "Communication in the Presence of Noise," Proceedings of the IRE, 1949, pp. 10-21, vol. 37, No. 1.
Simonyan et al., Very Deep Convolutional Networks for Large-Scale Image Recognition, arXiv:1409.1556v6, In International Conference on Learning Representations, Apr. 10, 2015, 14 pages.
Sohl-Dickstein et al., "Deep Unsupervised Learning using Nonequilibrium Thermodynamics," In International Conference on Machine Learning, PMLR, 2015, pp. 2256-2265 (arXiv:1502.03585v8 Nov. 18, 2015).
Song et al., "Score-Based Generative Modeling through Stochastic Differential Equations," In International Conference on Learning Representations, 2021, 36 pages.
Theis et al., "On the advantages of stochastic encoders," In Neural Compression Workshop at ICLR, 2021, 8 pages (arXiv:2102.09270v2 Apr. 29, 2021).
Theis et al., "A coding theorem for the rate-distortion-perception function," In Neural Compression Workshop at ICLR, 2021, 5 pages.
Theis et al., "Algorithms for the Communication of Samples," In Proceedings of the 39th International Conference on Machine Learning, PMLR, 2022, 21 pages.

(56) References Cited

OTHER PUBLICATIONS

Theis et al., "Lossy Image Compression with Compressive Autoencoders," In International Conference on Learning Representations, 2017, 19 pages (arXiv:1703.00395v1 Mar. 1, 2017).

Tschannen et al., Deep Generative Models for Distribution-Preserving Lossy Compression, 32nd Conference on Neural Information Processing Systems, 2018, 12 pages.

Vahdat et al., "Score-based Generative Modeling in Latent Space," 35th Conference on Neural Information Processing Systems, 2021, 16 pages.

Van den Oord et al., "Pixel Recurrent Neural Networks," Proceedings of the 33rd International Conference on Machine Learning, PMLR, 2016, pp. 1747-1756, vol. 48.

Wagner, Aaron B., "The Rate-Distortion-Perception Tradeoff: The Role of Common Randomness," arXiv:2202.04147v1, Feb. 8, 2022, 7 pages.

Watson et al., "Learning to Efficiently Sample from Diffusion Probabilistic Models," arXiv:2106.03802v1, Jun. 7, 2021, 13 pages.

Wu, Yihong, "Lecture Notes on: Information-Theoretic Methods in High-Dimensional Statistics," Jan. 14, 2020, 162 pages.

Yan et al., "On Perceptual Lossy Compression: The Cost of Perceptual Reconstruction and an Optimal Training Framework," Proceedings of the 38th International Conference on Machine Learning, PMLR, 2021, 16 pages.

Yang et al., "An Introduction to Neural Data Compression," Foundations and Trends in Computer Graphics and Vision, 2022, 91 pages.

Zamir et al., "Information Rates of Pre/Post-Filtered Dithered Quantizers," IEEE Tranactions on Information Theory, Sep. 1996, pp. 1340-1353, vol. 42, No. 5.

Zeghidour et al., "Soundstream: An End-to-End Neural Audio Codec," arXiv:2107.03312v1, Jul. 7, 2021, 12 pages.

Zhang et al,. "Fast Sampling of Diffusion Models with Exponential Integrator," ICLR, arXiv:2204.13902v4, Feb. 25, 2023, 33 pages.

Zhang et al., "The Unreasonable Effectiveness of Deep Features as a Perceptual Metric," In IEEE/CVF Conference on Computer Vision and Pattern Recognition, 2018, pp. 586-595.

Zhang et al., "Universal Rate-Distortion-Perception Representations for Lossy Compression," 35th Conference on Neural Information Processing Systems, 2021, 13 pages.

\* cited by examiner

LOSSY COMPRESSION WITH GAUSSIAN DIFFUSION

CROSS-REFERENCE TO RELATED DISCLOSURE

This application claims priority to U.S. Provisional Patent Application No. 63/365,013, filed on May 19, 2022, which is incorporated herein by reference in its entirety.

BACKGROUND

Machine learning models may be used to process various types of data, including images, video, time series, text, and/or point clouds, among other possibilities. Improvements in the machine learning models and/or the training processes thereof may allow the models to carry out the processing of data faster and/or utilize fewer computing resources for the processing, among other benefits.

SUMMARY

In an embodiment, a method of encoding data includes determining, by an encoder, a first data instance by corrupting the data with Gaussian noise. The method also includes determining, by the encoder, information representative of one or more conditional distributions. The information representative of the one or more conditional distributions are between sequential data instances in a sequence of progressively less corrupted data instances starting from the first data instance. The method further includes determining, by the encoder, an index of a corrupted data instance of the sequence of progressively less corrupted data instances. The index corresponds with a conditional distribution of the one or more conditional distributions which causes the corrupted data instance to have a desired bit-rate. The method additionally includes transmitting, from the encoder to a decoder, the first data instance and the information representative of the one or more conditional distributions to enable the decoder to recover the corrupted data instance having the desired bit-rate and use the corrupted data instance to generate output data representative of the data. In another embodiment, a system includes a processor and a non-transitory computer-readable medium having stored thereon instructions that, when executed by the processor, cause the processor to perform operations of encoding data. The operations include determining, by an encoder, a first data instance by corrupting the data with Gaussian noise. The operations also include determining, by the encoder, information representative of one or more conditional distributions. The information representative of the one or more conditional distributions are between sequential data instances in a sequence of progressively less corrupted data instances starting from the first data instance. The operations further include determining, by the encoder, an index of a corrupted data instance of the sequence of progressively less corrupted data instances. The index corresponds with a conditional distribution of the one or more conditional distributions which causes the corrupted data instance to have a desired bit-rate. The operations additionally include transmitting, from the encoder to a decoder, the first data instance and the information representative of the one or more conditional distributions to enable the decoder to recover the corrupted data instance having the desired bit-rate and use the corrupted data instance to generate output data representative of the data.

In another embodiment, a non-transitory computer readable medium is provided which includes program instructions executable by at least one processor to cause the at least one processor to perform functions of encoding data. The functions include determining, by an encoder, a first data instance by corrupting the data with Gaussian noise. The functions also include determining, by the encoder, information representative of one or more conditional distributions. The information representative of the one or more conditional distributions are between sequential data instances in a sequence of progressively less corrupted data instances starting from the first data instance. The functions further include determining, by the encoder, an index of a corrupted data instance of the sequence of progressively less corrupted data instances. The index corresponds with a conditional distribution of the one or more conditional distributions which causes the corrupted data instance to have a desired bit-rate. The functions further include transmitting, from the encoder to a decoder, the first data instance and the information representative of the one or more conditional distributions to enable the decoder to recover the corrupted data instance having the desired bit-rate and use the corrupted data instance to generate output data representative of the data.

In a further embodiment, a system is provided that includes means of encoding data. The system includes means for determining, by an encoder, a first data instance by corrupting the data with Gaussian noise. The system also includes means for determining, by the encoder, information representative of one or more conditional distributions. The information representative of the one or more conditional distributions are between sequential data instances in a sequence of progressively less corrupted data instances starting from the first data instance. The system additionally includes means for determining, by the encoder, an index of a corrupted data instance of the sequence of progressively less corrupted data instances. The index corresponds with a conditional distribution of the one or more conditional distributions which causes the corrupted data instance to have a desired bit-rate. The system further includes means for transmitting, from the encoder to a decoder, the first data instance and the information representative of the one or more conditional distributions to enable the decoder to recover the corrupted data instance having the desired bit-rate and use the corrupted data instance to generate output data representative of the data.

In an additional embodiment, a method of decoding data is provided. The method includes receiving, by a decoder from an encoder, a first data instance and information representative of one or more conditional distributions. The information representative of the one or more conditional distributions are between sequential data instances in a sequence of progressively less corrupted data instances starting from the first data instance. The method also includes determining, by the decoder and based on the first data instance and the information representative of the one or more conditional distributions, a corrupted data instance of the sequence of progressively less corrupted data instances. The corrupted data instance has a desired bit-rate. The method further includes generating, by the decoder based on the corrupted data instance, output data representative of the data. The output data is one of one or more predicted data instances generated sequentially starting from the corrupted data instance.

In another embodiment, a system includes a processor and a non-transitory computer-readable medium having stored thereon instructions that, when executed by the processor, cause the processor to perform operations of encoding data. The operations include receiving, by a decoder from an encoder, a first data instance and information representative of one or more conditional distributions. The information representative of the one or more conditional distributions are between sequential data instances in a sequence of progressively less corrupted data instances starting from the first data instance. The operations additionally include determining, by the decoder and based on the first data instance and the information representative of the one or more conditional distributions, a corrupted data instance of the sequence of progressively less corrupted data instances. The corrupted data instance has a desired bit-rate. The operations further include generating, by the decoder based on the corrupted data instance, output data representative of the data. The output data is one of one or more predicted data instances generated sequentially starting from the corrupted data instance.

In another embodiment, a non-transitory computer-readable medium is provided which includes program instructions executable by at least one processor to cause the at least one processor to perform functions of decoding data. The functions include receiving, by a decoder from an encoder, a first data instance and information representative of one or more conditional distributions between sequential data instances in a sequence of progressively less corrupted data instances starting from the first data instance. The functions additionally include determining, by the decoder and based on the first data instance and the information representative of the one or more conditional distributions, a corrupted data instance of the sequence of progressively less corrupted data instances. The corrupted data instance has a desired bit-rate. The functions further include generating, by the decoder based on the corrupted data instance, output data representative of the data. The output data is one of one or more predicted data instances generated sequentially starting from the corrupted data instance.

In a further embodiment, a system is provided that includes means for decoding data. The system includes means for receiving, by a decoder from an encoder, a first data instance and information representative of one or more conditional distributions between sequential data instances in a sequence of progressively less corrupted data instances starting from the first data instance. The system additionally includes means for determining, by the decoder and based on the first data instance and the information representative of the one or more conditional distributions, a corrupted data instance of the sequence of progressively less corrupted data instances. The corrupted data instance has a desired bit-rate. The system further includes means for generating, by the decoder based on the corrupted data instance, output data representative of the data. The output data is one of one or more predicted data instances generated sequentially starting from the corrupted data instance.

The foregoing summary is illustrative only and is not intended to be in any way limiting. In addition to the illustrative aspects, embodiments, and features described above, further aspects, embodiments, and features will become apparent by reference to the figures and the following detailed description and the accompanying drawings.

DETAILED DESCRIPTION

Figure 1:
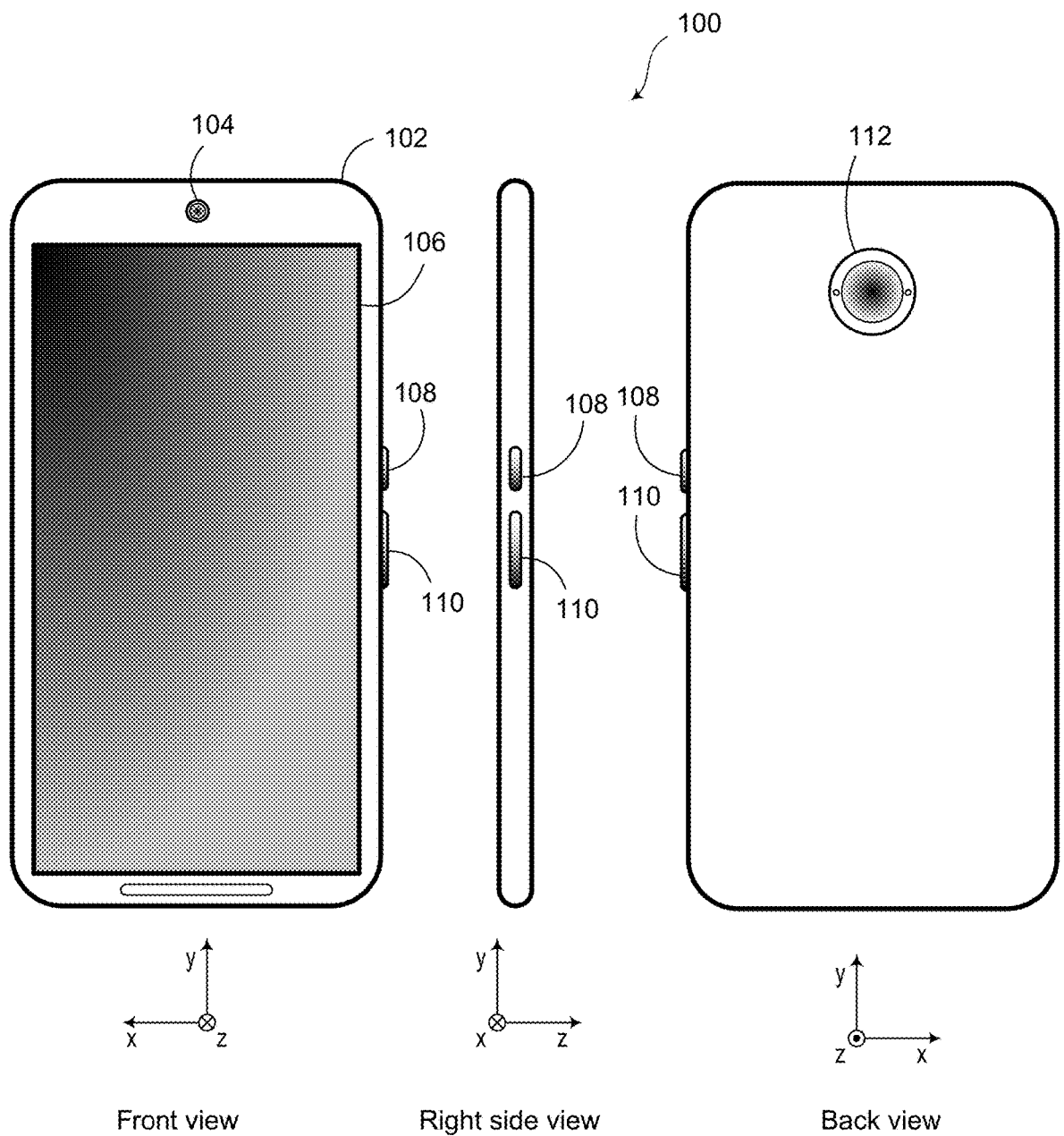
FIG. 1 illustrates an example computing device, in accordance with example embodiments.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features unless indicated as such. Other embodiments can be utilized, and other changes can be made, without departing from the scope of the subject matter presented herein.

Thus, the example embodiments described herein are not meant to be limiting. It will be readily understood that the aspects of the present disclosure, as generally described herein, and illustrated in the figures, can be arranged, substituted, combined, separated, and designed in a wide variety of different configurations.

Throughout this description, the articles "a" or "an" are used to introduce elements of the example embodiments. Any reference to "a" or "an" refers to "at least one," and any reference to "the" refers to "the at least one," unless otherwise specified, or unless the context clearly dictates otherwise. The intent of using the conjunction "or" within a described list of at least two terms is to indicate any of the listed terms or any combination of the listed terms.

The use of ordinal numbers such as "first," "second," "third" and so on is to distinguish respective elements rather than to denote a particular order of those elements. For the purpose of this description, the terms "multiple" and "a plurality of" refer to "two or more" or "more than one."

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment. In the figures, similar symbols typically identify similar components, unless context dictates otherwise. Further, unless otherwise noted, figures are not drawn to scale and are used for illustrative purposes only. Moreover, the figures are representational only and not all components are shown. For example, additional structural or restraining components might not be shown.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Overview

A computing device may use compression algorithms on various types of data, including audio files, video files, images, documents, among other examples. Compressing data may allow for the data to occupy less storage space, to be transmitted more quickly, and to be transmitted using less bandwidth.

Compression algorithms may be lossy or lossless. Lossless compression algorithms may allow for data to be reconstructed from the compressed data without any loss of information (e.g., a perfect reconstruction of the data). Lossy compression algorithms may generally attempt to compress data to occupy as little storage as possible, while simultaneously introducing as little distortion as possible. Reconstructed data from using lossy compression algorithms may be nearly indistinguishable from the original data and/or appear fairly realistic.

In general, there may be a tradeoff between reliably reconstructing the data with as little distortion as possible and the amount of storage the compressed data occupies. In particular, less compressed data may occupy more storage space but may result in reconstructed data having less distortion. Whereas, more compressed data may occupy less storage space but may result in more distorted data when reconstructed.

The present disclosure includes methods of encoding and decoding data to allow compressed data to be reconstructed at various bit-rates using a single machine learning model. To compress an image, an encoder may add various amounts of Gaussian noise to data. More Gaussian noise may result in the compressed data occupying less storage space but may also result in more loss of information, which may result in a less accurate reconstruction of the data from the compressed data. The encoder may determine information representative of one or more conditional distributions between sequential data instances in a sequence of progressively less corrupted data instances starting from the first data instance. Further, the encoder may transmit the information representative of the one or more conditional distributions and the first data instance to a decoder. A decoder may determine a corrupted data instance based on the transmitted information representative of the conditional distributions and the transmitted first data instance. Based on the corrupted data instance, the decoder may determine output data that resembles the original data. By using a trained machine learning model to generate the output data starting from the corrupted data instance, the decoder may produce a realistic output.

Example Systems and Methods

FIG. 1 illustrates an example computing device 100. Computing device 100 is shown in the form factor of a mobile phone. However, computing device 100 may be alternatively implemented as a laptop computer, a tablet computer, and/or a wearable computing device, among other possibilities. Computing device 100 may include various elements, such as body 102, display 106, and buttons 108 and 110. Computing device 100 may further include one or more cameras, such as front-facing camera 104 and rear-facing camera 112.

Front-facing camera 104 may be positioned on a side of body 102 typically facing a user while in operation (e.g., on the same side as display 106). Rear-facing camera 112 may be positioned on a side of body 102 opposite front-facing camera 104. Referring to the cameras as front and rear facing is arbitrary, and computing device 100 may include multiple cameras positioned on various sides of body 102.

Display 106 could represent a cathode ray tube (CRT) display, a light emitting diode (LED) display, a liquid crystal (LCD) display, a plasma display, an organic light emitting diode (OLED) display, or any other type of display known in the art. In some examples, display 106 may display a digital representation of the current image being captured by front-facing camera 104 and/or rear-facing camera 112, an image that could be captured by one or more of these cameras, an image that was recently captured by one or more of these cameras, and/or a modified version of one or more of these images. Thus, display 106 may serve as a viewfinder for the cameras. Display 106 may also support touchscreen functions that may be able to adjust the settings and/or configuration of one or more aspects of computing device 100.

Front-facing camera 104 may include an image sensor and associated optical elements such as lenses. Front-facing camera 104 may offer zoom capabilities or could have a fixed focal length. In other examples, interchangeable lenses could be used with front-facing camera 104. Front-facing camera 104 may have a variable mechanical aperture and a mechanical and/or electronic shutter. Front-facing camera 104 also could be configured to capture still images, video images, or both. Further, front-facing camera 104 could represent, for example, a monoscopic, stereoscopic, or multiscopic camera. Rear-facing camera 112 may be similarly or differently arranged. Additionally, one or more of front-facing camera 104 and/or rear-facing camera 112 may be an array of one or more cameras.

One or more of front-facing camera 104 and/or rear-facing camera 112 may include or be associated with an illumination component that provides a light field to illuminate a target object. For instance, an illumination component could provide flash or constant illumination of the target object. An illumination component could also be configured to provide a light field that includes one or more of structured light, polarized light, and light with specific spectral content. Other types of light fields known and used to recover three-dimensional (3D) models from an object are possible within the context of the examples herein.

Computing device 100 could be configured to use display 106 and front-facing camera 104 and/or rear-facing camera 112 to capture images of a target object. The captured images could be a plurality of still images or a video stream. The image capture could be triggered by activating button 108, pressing a softkey on display 106, or by some other mechanism. Depending upon the implementation, the images could be captured automatically at a specific time interval, for example, upon pressing button 108, upon appropriate lighting conditions of the target object, upon moving computing device 100 a predetermined distance, or according to a predetermined capture schedule.

Figure 2:
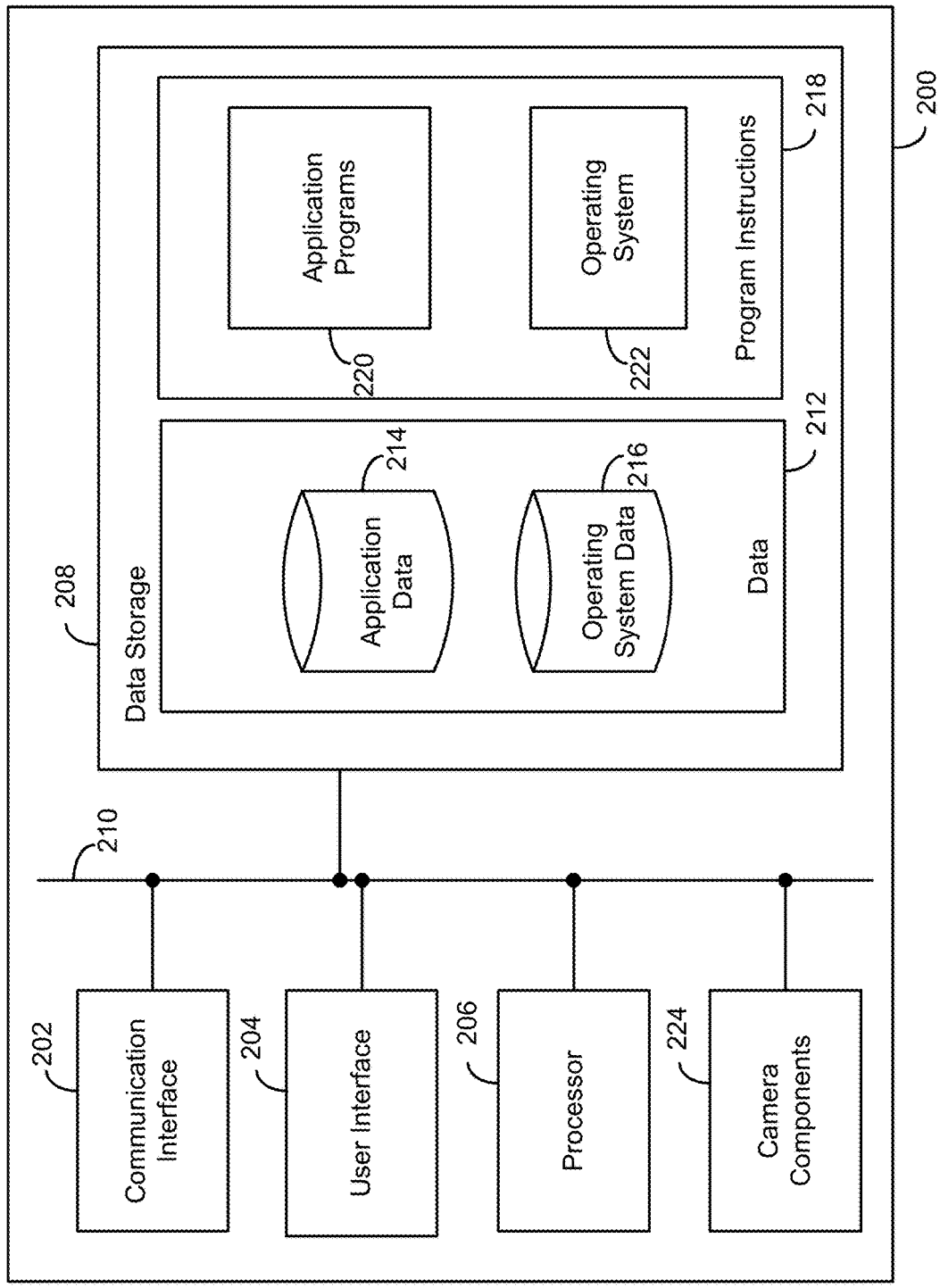
FIG. 2 is a simplified block diagram showing some of the components of an example computing system.

FIG. 2 is a simplified block diagram showing some of the components of an example computing system 200. By way of example and without limitation, computing system 200 may be a cellular mobile telephone (e.g., a smartphone), a computer (such as a desktop, notebook, tablet, server, or handheld computer), a home automation component, a digital video recorder (DVR), a digital television, a remote control, a wearable computing device, a gaming console, a robotic device, a vehicle, or some other type of device. Computing system 200 may represent, for example, aspects of computing device 100.

As shown in FIG. 2, computing system 200 may include communication interface 202, user interface 204, processor 206, data storage 208, and camera components 224, all of which may be communicatively linked together by a system bus, network, or other connection mechanism 210. Computing system 200 may be equipped with at least some image capture and/or image processing capabilities. It should be understood that computing system 200 may represent a physical image processing system, a particular physical hardware platform on which an image sensing and/or processing application operates in software, or other combinations of hardware and software that are configured to carry out image capture and/or processing functions.

Communication interface 202 may allow computing system 200 to communicate, using analog or digital modulation, with other devices, access networks, and/or transport networks. Thus, communication interface 202 may facilitate circuit-switched and/or packet-switched communication, such as plain old telephone service (POTS) communication and/or Internet protocol (IP) or other packetized communication. For instance, communication interface 202 may include a chipset and antenna arranged for wireless communication with a radio access network or an access point. Also, communication interface 202 may take the form of or include a wireline interface, such as an Ethernet, Universal Serial Bus (USB), or High-Definition Multimedia Interface (HDMI) port, among other possibilities. Communication interface 202 may also take the form of or include a wireless interface, such as a Wi-Fi, BLUETOOTH®, global positioning system (GPS), or wide-area wireless interface (e.g., WiMAX or 3GPP Long-Term Evolution (LTE)), among other possibilities. However, other forms of physical layer interfaces and other types of standard or proprietary communication protocols may be used over communication interface 202. Furthermore, communication interface 202 may comprise multiple physical communication interfaces (e.g., a Wi-Fi interface, a BLUETOOTH® interface, and a wide-area wireless interface).

User interface 204 may function to allow computing system 200 to interact with a human or non-human user, such as to receive input from a user and to provide output to the user. Thus, user interface 204 may include input components such as a keypad, keyboard, touch-sensitive panel, computer mouse, trackball, joystick, microphone, and so on. User interface 204 may also include one or more output components such as a display screen, which, for example, may be combined with a touch-sensitive panel. The display screen may be based on CRT, LCD, LED, and/or OLED technologies, or other technologies now known or later developed. User interface 204 may also be configured to generate audible output(s), via a speaker, speaker jack, audio output port, audio output device, earphones, and/or other similar devices. User interface 204 may also be configured to receive and/or capture audible utterance(s), noise(s), and/or signal(s) by way of a microphone and/or other similar devices.

In some examples, user interface 204 may include a display that serves as a viewfinder for still camera and/or video camera functions supported by computing system 200. Additionally, user interface 204 may include one or more buttons, switches, knobs, and/or dials that facilitate the configuration and focusing of a camera function and the capturing of images. It may be possible that some or all of these buttons, switches, knobs, and/or dials are implemented by way of a touch-sensitive panel.

Processor 206 may comprise one or more general purpose processors e.g., microprocessors—and/or one or more special purpose processors—e.g., digital signal processors (DSPs), graphics processing units (GPUs), floating point units (FPUs), network processors, or application-specific integrated circuits (ASICs). In some instances, special purpose processors may be capable of image processing, image alignment, and merging images, among other possibilities. Data storage 208 may include one or more volatile and/or non-volatile storage components, such as magnetic, optical, flash, or organic storage, and may be integrated in whole or in part with processor 206. Data storage 208 may include removable and/or non-removable components.

Processor 206 may be capable of executing program instructions 218 (e.g., compiled or non-compiled program logic and/or machine code) stored in data storage 208 to carry out the various functions described herein. Therefore, data storage 208 may include a non-transitory computer-readable medium, having stored thereon program instructions that, upon execution by computing system 200, cause computing system 200 to carry out any of the methods, processes, or operations disclosed in this specification and/or the accompanying drawings. The execution of program instructions 218 by processor 206 may result in processor 206 using data 212.

By way of example, program instructions 218 may include an operating system 222 (e.g., an operating system kernel, device driver(s), and/or other modules) and one or more application programs 220 (e.g., camera functions, address book, email, web browsing, social networking, audio-to-text functions, text translation functions, and/or gaming applications) installed on computing system 200. Similarly, data 212 may include operating system data 216 and application data 214. Operating system data 216 may be accessible primarily to operating system 222, and application data 214 may be accessible primarily to one or more of application programs 220. Application data 214 may be arranged in a file system that is visible to or hidden from a user of computing system 200.

Application programs 220 may communicate with operating system 222 through one or more application programming interfaces (APIs). These APIs may facilitate, for instance, application programs 220 reading and/or writing application data 214, transmitting or receiving information via communication interface 202, receiving and/or displaying information on user interface 204, and so on.

In some cases, application programs 220 may be referred to as "apps" for short. Additionally, application programs 220 may be downloadable to computing system 200 through one or more online application stores or application markets. However, application programs can also be installed on computing system 200 in other ways, such as via a web browser or through a physical interface (e.g., a USB port) on computing system 200.

Camera components 224 may include, but are not limited to, an aperture, shutter, recording surface (e.g., photographic film and/or an image sensor), lens, shutter button, infrared projectors, and/or visible-light projectors. Camera components 224 may include components configured for capturing of images in the visible-light spectrum (e.g., electromagnetic radiation having a wavelength of 380-700 nanometers) and/or components configured for capturing of images in the infrared light spectrum (e.g., electromagnetic radiation having a wavelength of 701 nanometers-1 millimeter), among other possibilities. Camera components 224 may be controlled at least in part by software executed by processor 206.

Figure 3:
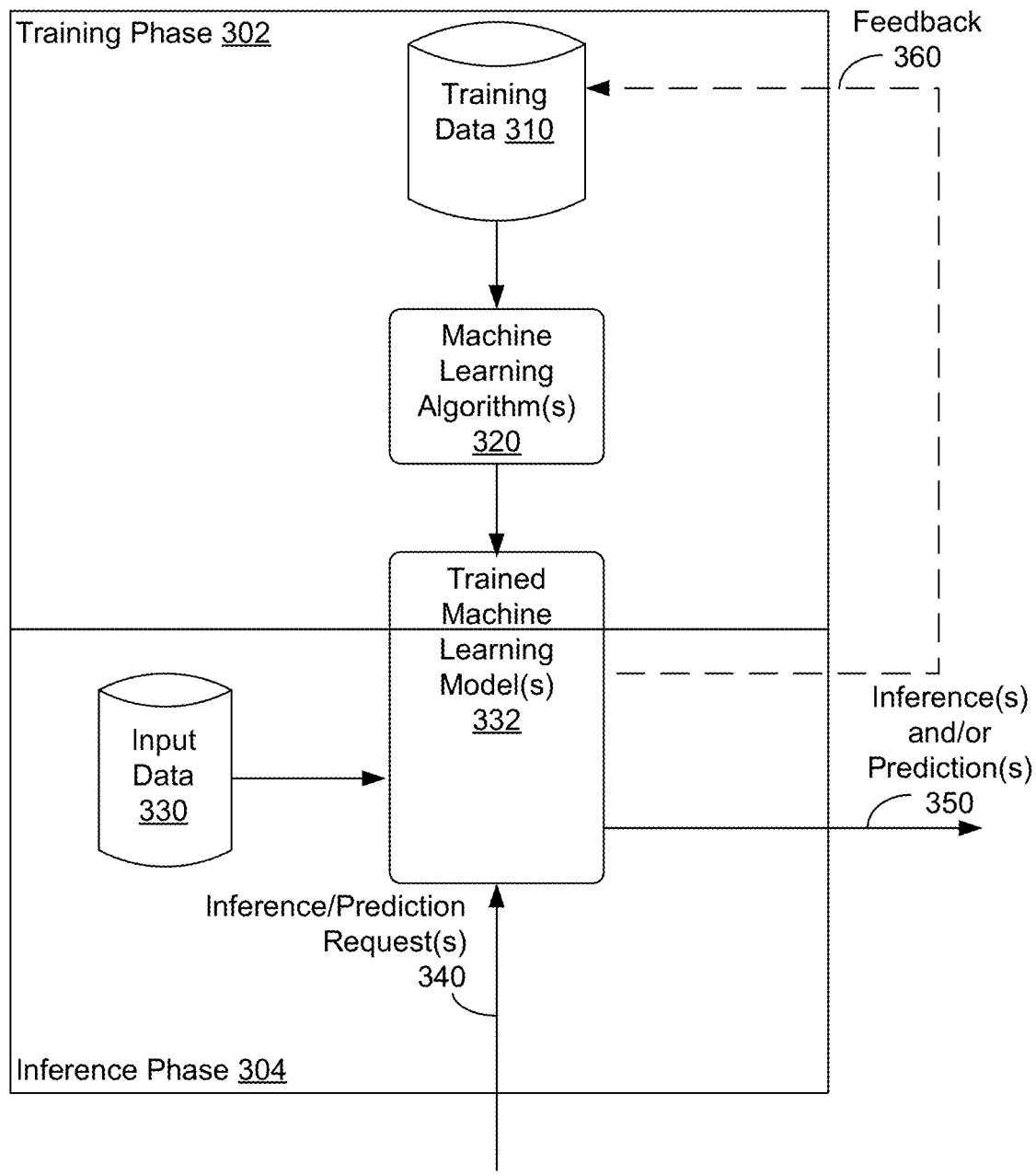
FIG. 3 is a diagram illustrating a training phase and an inference phase of one or more trained machine learning models in accordance with example embodiments.

FIG. 3 shows diagram 300 illustrating a training phase 302 and an inference phase 304 of trained machine learning model(s) 332, in accordance with example embodiments. Some machine learning techniques involve training one or more machine learning algorithms on an input set of training data to recognize patterns in the training data and provide output inferences and/or predictions about (patterns in the) training data. The resulting trained machine learning algorithm can be termed as a trained machine learning model. For example, FIG. 3 shows training phase 302 where one or more machine learning algorithms 320 are being trained on training data 310 to become trained machine learning model 332. Producing trained machine learning model(s) 332 during training phase 302 may involve determining one or more hyperparameters, such as one or more stride values for one or more layers of a machine learning model as described herein.

Then, during inference phase 304, trained machine learning model 332 can receive input data 330 and one or more inference/prediction requests 340 (perhaps as part of input data 330) and responsively provide as an output one or more inferences and/or predictions 350. The one or more inferences and/or predictions 350 may be based in part on one or more learned hyperparameters, such as one or more learned stride values for one or more layers of a machine learning model as described herein As such, trained machine learning model(s) 332 can include one or more models of one or more machine learning algorithms 320. Machine learning algorithm(s) 320 may include, but are not limited to: an artificial neural network (e.g., a herein-described convolutional neural networks, a recurrent neural network, a Bayesian network, a hidden Markov model, a Markov decision process, a logistic regression function, a support vector machine, a suitable statistical machine learning algorithm, and/or a heuristic machine learning system). Machine learning algorithm(s) 120 may be supervised or unsupervised, and may implement any suitable combination of online and offline learning.

In some examples, machine learning algorithm(s) 320 and/or trained machine learning model(s) 332 can be accelerated using on-device coprocessors, such as graphic processing units (GPUs), tensor processing units (TPUs), digital signal processors (DSPs), and/or application specific integrated circuits (ASICs). Such on-device coprocessors can be used to speed up machine learning algorithm(s) 320 and/or trained machine learning model(s) 332. In some examples, trained machine learning model(s) 332 can be trained, reside and execute to provide inferences on a particular computing device, and/or otherwise can make inferences for the particular computing device.

During training phase 302, machine learning algorithm(s) 320 can be trained by providing at least training data 310 as training input using unsupervised, supervised, semi-supervised, and/or reinforcement learning techniques. Unsupervised learning involves providing a portion (or all) of training data 310 to machine learning algorithm(s) 320 and machine learning algorithm(s) 320 determining one or more output inferences based on the provided portion (or all) of training data 310. Supervised learning involves providing a portion of training data 310 to machine learning algorithm(s) 320, with machine learning algorithm(s) 320 determining one or more output inferences based on the provided portion of training data 310, and the output inference(s) are either accepted or corrected based on correct results associated with training data 310. In some examples, supervised learning of machine learning algorithm(s) 320 can be governed by a set of rules and/or a set of labels for the training input, and the set of rules and/or set of labels may be used to correct inferences of machine learning algorithm(s) 320.

Semi-supervised learning involves having correct results for part, but not all, of training data 310. During semi-supervised learning, supervised learning is used for a portion of training data 310 having correct results, and unsupervised learning is used for a portion of training data 310 not having correct results. Reinforcement learning involves machine learning algorithm(s) 320 receiving a reward signal regarding a prior inference, where the reward signal can be a numerical value. During reinforcement learning, machine learning algorithm(s) 320 can output an inference and receive a reward signal in response, where machine learning algorithm(s) 320 are configured to try to maximize the numerical value of the reward signal. In some examples, reinforcement learning also utilizes a value function that provides a numerical value representing an expected total of the numerical values provided by the reward signal over time. In some examples, machine learning algorithm(s) 320 and/or trained machine learning model(s) 332 can be trained using other machine learning techniques, including but not limited to, incremental learning and curriculum learning.

In some examples, machine learning algorithm(s) 320 and/or trained machine learning model(s) 332 can use transfer learning techniques. For example, transfer learning techniques can involve trained machine learning model(s) 332 being pretrained on one set of data and additionally trained using training data 310. More particularly, machine learning algorithm(s) 320 can be pre-trained on data from one or more computing devices and a resulting trained machine learning model provided to computing device CD1, where CD1 is intended to execute the trained machine learning model during inference phase 304. Then, during training phase 302, the pre-trained machine learning model can be additionally trained using training data 310. This further training of the machine learning algorithm(s) 320 and/or the pre-trained machine learning model using training data 310 of CD1's data can be performed using either supervised or unsupervised learning. Once machine learning algorithm(s) 320 and/or the pre-trained machine learning model has been trained on at least training data 310, training phase 302 can be completed. The trained resulting machine learning model can be utilized as at least one of trained machine learning model(s) 332.

In particular, once training phase 302 has been completed, trained machine learning model(s) 332 can be provided to a computing device, if not already on the computing device. Inference phase 304 can begin after trained machine learning model(s) 332 are provided to computing device CD1.

During inference phase 304, trained machine learning model(s) 332 can receive input data 330 and generate and output one or more corresponding inferences and/or predictions 350 about input data 330. As such, input data 330 can be used as an input to trained machine learning model(s) 332 for providing corresponding inference(s) and/or prediction (s) 350. For example, trained machine learning model(s) 332 can generate inference(s) and/or prediction(s) 350 in response to one or more inference/prediction requests 340.

In some examples, trained machine learning model(s) 332 can be executed by a portion of other software. For example, trained machine learning model(s) 332 can be executed by an inference or prediction daemon to be readily available to provide inferences and/or predictions upon request. Input data 330 can include data from computing device CD1 executing trained machine learning model(s) 332 and/or input data from one or more computing devices other than CD1.

Figure 4:
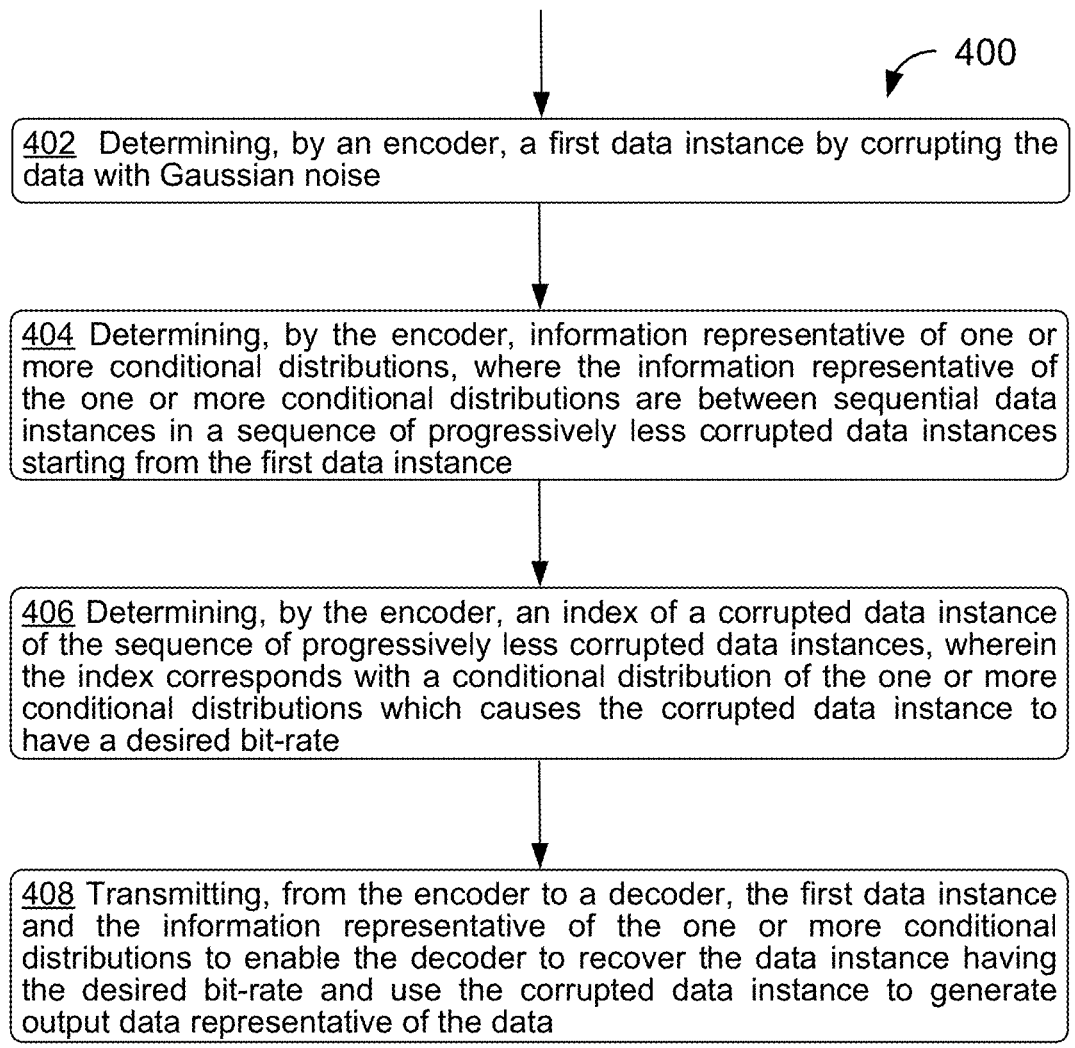
FIG. 4 is a flowchart of a method, in accordance with example embodiments.

FIG. 4 is a flow chart of method 400 of encoding data, in accordance with example embodiments. Method 400 may be executed by one or more processors.

At block 402, method 400 may include determining, by an encoder, a first data instance by corrupting the data with Gaussian noise.

At block 404, method 400 may include determining, by the encoder, information representative of one or more conditional distributions, where the information representative of the one or more conditional distributions are between sequential data instances in a sequence of progressively less corrupted data instances starting from the first data instance.

At block 406, method 400 may include determining, by the encoder, an index of a corrupted data instance of the sequence of progressively less corrupted data instances, where the index corresponds with a conditional distribution of the one or more conditional distributions which causes the corrupted data instance to have a desired bit-rate.

At block 408, method 400 may include transmitting, from the encoder to a decoder, the first data instance and the information representative of the one or more conditional distributions to enable the decoder to recover the corrupted data instance having the desired bit-rate and use the corrupted data instance to generate output data representative of the data.

In some embodiments, the data may be an image, an audio segment, or a video segment.

In some embodiments, the first data instance may occupy less storage than the data.

In some embodiments, the corrupted data instance with the desired bit-rate may occupy less storage than the data and may occupy more storage than the first data instance.

In some embodiments, method 400 may further include determining the desired bit-rate based on the corrupted data instance occupying a desired storage amount.

In some embodiments, method 400 may further include determining a desired bit-rate from a series of bit-rates, where the series of bit-rates comprises a high bit-rate and a low bit-rate, where a corrupted data instance having a high bit-rate occupies a higher data storage amount than a corrupted data instance having a low bit-rate, where the output data generated from the corrupted data instance having the high bit-rate is more representative of the data than output data generated from the corrupted data instance having the low bit-rate.

In some embodiments, determining the first data instance by corrupting the data with Gaussian noise may include determining a plurality of Gaussian noise values, wherein the Gaussian noise values are distributed normally and adding the plurality of Gaussian noise values to the data.

In some embodiments, the encoder may be run on a server device and the decoder may be run on a mobile device, where transmitting the first data instance and the information representative of the one or more conditional distributions further enables the server device to transmit to the mobile device a representation of the data that occupies less storage than the data.

In some embodiments, the sequence of progressively less corrupted data instances may include the first data instance and a second data instance, where the second data instance depends on the first data instance.

In some embodiments, the information representative of the one or more conditional distributions may include information representative of a first conditional distribution, where the second data instance is the first data instance given the information representative of the first conditional distribution.

In some embodiments, method 400 may further include receiving a request to transmit a representation of the data, where determining the first data instance is in response to receiving the request.

In some embodiments, transmitting, from the encoder to the decoder, the first data instance and the information representative of the one or more conditional distributions may further include transmitting information representative of each of the one or more conditional distributions using one or more separate messages at one or more different points in time.

In some embodiments, transmitting, from the encoder to the decoder, the first data instance and the information representative of the one or more conditional distributions may include transmitting information representative of each of the one or more conditional distributions using a single message at a single point in time.

In some embodiments, the encoder may not transmit conditional distributions. Instead, the encoder may transmit only enough information to reconstruct a sample that follows a respective conditional distribution. For example, a computing device may be able to transmit a a uniform distribution over an interval from A to B by transmitting the values of A and B. To save space, the encoder may instead transmit a single value X that is randomly distributed over A to B rather than the values of A and B themselves.

In some embodiments, transmitting information representative of a conditional distribution may use variations of "rejection sampling" and/or variations of dithered quantization. For example, for rejection sampling, an encoder may use a pseudo-number generator with a fixed seed value to generate samples $Z_1, Z_2, Z_3, \ldots, Z_N$ which follow a distribution p(Z). The encoder may select one of the candidates $Z_K$, such that $Z_K$ approximately follows a distribution q(Z). The encoder may transmit index K. The decoder may receive K, and the decoder may reconstruct $Z_K$ by using the same pseudo-random number generator with the same seed that the encoder used. Further, for dithered quantization, the encoder may generate, using a pseudo-random number generator, a random vector U which is independent of the data. The encoder may determine K=Q(X−U), where X may be the data and Q may quantize the input (e.g., rounding to a nearest integer). The encoder may transmit K. The decoder may also generate U using the same pseudo-random number generator with the same seed as the encoder. After receiving U, the decoder may compute Z=K+U. In some embodiments, for some distributions, Q and U may be designed so that Z=Q(X−U)+U follows approximately the correct distribution. Other examples of transmitting information representative of a conditional distribution are also possible.

Figure 5:
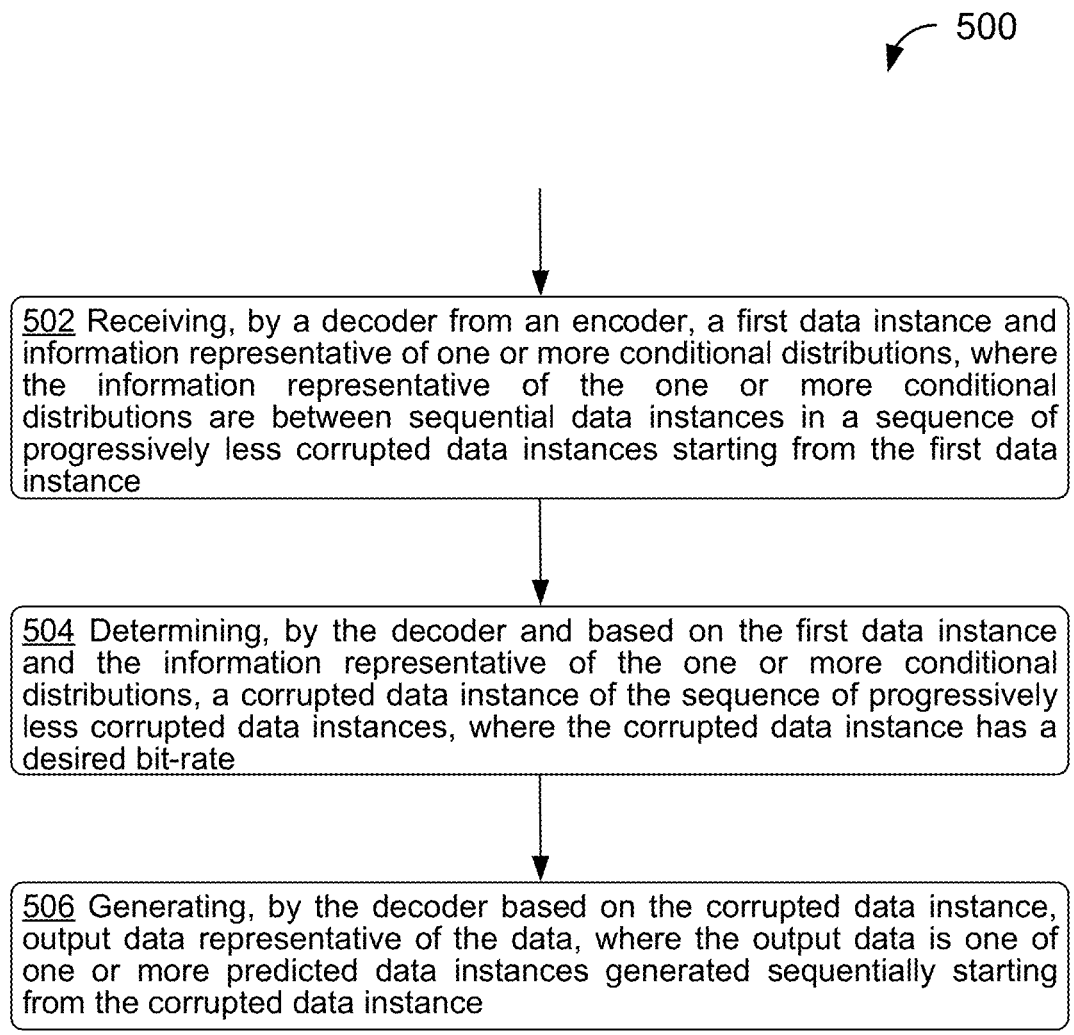
FIG. 5 is a flowchart of a method, in accordance with example embodiments.

FIG. 5 is a flow chart of method 500 of decoding data, in accordance with example embodiments. Method 500 may be executed by one or more processors.

At block 502, method 500 may include receiving, by a decoder from an encoder, a first data instance and information representative of one or more conditional distributions, where the information representative of the one or more conditional distributions are between sequential data instances in a sequence of progressively less corrupted data instances starting from the first data instance.

At block 504, method 500 may include determining, by the decoder and based on the first data instance and the information representative of the one or more conditional distributions, a corrupted data instance of the sequence of progressively less corrupted data instances, where the corrupted data instance has a desired bit-rate.

At block 506, method 500 may include generating, by the decoder based on the corrupted data instance, output data representative of the data, wherein the output data is one of one or more predicted data instances generated sequentially starting from the corrupted data instance.

In some embodiments, method 500 may further include determining, based on the first data instance and information representative of a conditional distribution between the first data instance and a second data instance of the sequential data instances, the second data instance in the sequence of progressively less corrupted data instances.

In some embodiments, method 500 may further include determining, based on the second data instance and information representative of a conditional distribution between the second data instance and a third data instance of the sequential data instances, the third data instance in the sequence of progressively less corrupted data instances.

In some embodiments, generating, by the decoder based on the corrupted data instance, output data representative of the data may include inputting the corrupted data instance into a diffusion generative model to obtain a first predicted data instance of the one or more predicted data instances. In some embodiments, generating, by the decoder based on the corrupted data instance, output data representative of the data may further include inputting the first predicted data instance into the diffusion generative model to obtain a second predicted data instance of the one or more predicted data instances.

In some embodiments, the first data instance may occupy less storage than the corrupted data instance of the sequence of progressively less corrupted data instances.

In some embodiments, the data may include an image, where method 400 further includes displaying the output data on a display device.

In some embodiments, the encoder and the decoder may be run on a computing device, where generating the output data is performed by the computing device in response to receiving, by the decoder from the encoder, the first data instance and the one or more conditional distributions.

In some embodiments, a system may include a processor and a non-transitory computer-readable medium having stored thereon instructions that, when executed by the processor, cause the processor to perform operations in accordance with any of methods described above and/or below.

In some embodiments, a non-transitory computer-readable medium having stored thereon instructions that, when executed by a computing device, may cause the computing device to perform operations in accordance with any of the methods described above and/or below.

Example Applications

In some embodiments, the methods of encoding data, the methods of decoding data, the encoder, and/or the decoder as described herein may be used to transmit data and store data.

In some examples, the methods of encoding data, the methods of decoding data, the encoder and/or the decoder as described herein may be used for compressing audio files, image files, video files, among other documents.

In some embodiments, the methods of encoding data, the methods of decoding data, the encoder, and/or the decoder as described herein may be used for transmitting data by a system including a server and a mobile device. For example, a server device may use the method of encoding data described herein to send data to a mobile device, which may use the method of decoding data described herein. As another example, a user could capture an image or other content using a computing device, e.g., computing device 100. The computing device may use the method of encoding data described herein to send the image or other content to a server device, perhaps for storage, and the server device may use the method of decoding data described herein.

In some embodiments, the methods of encoding data, the methods of decoding data, the encoder, and/or the decoder as described herein may be used for downloading large quantities of data, e.g., datasets.

In some embodiments, the methods of encoding data, the methods of decoding data, the encoder, and/or the decoder as described herein may be used for transmitting data over a wired connection (e.g., from a USB drive to a solid state drive of a laptop or personal computer or vice versa).

In some embodiments, the methods of encoding data, the methods of decoding data, the encoder, and/or the decoder as described herein may be used for transmitting data for backup purposes, e.g., from one server to another server.

In some embodiments, the methods of encoding data, the methods of decoding data, the encoder, and/or the decoder as described herein may be used for streaming services. In particular, the methods described herein may facilitate rapid communication of data that occupies a lot of storage space, e.g., video content.

In some embodiments, the methods of encoding data, the methods of decoding data, the encoder, and/or the decoder as described herein may be used for email attachments. For example, when an image, video clip, document, etc. is attached to an email, the computing device may encode and transmit the information using the encoding methods described herein, and another computing device may use the decoding methods described herein to receive the information.

In some embodiments, the methods of encoding data, the methods of decoding data, the encoder, and/or the decoder as described herein may be used for enhancing details of transmitted images that occupy less storage space.

In some embodiments, the methods of encoding data, the methods of decoding data, the encoder, and/or the decoder as described herein may be used for transmitting data wirelessly when wireless networks are intermittently available.

In some embodiments, the methods of encoding data, the methods of decoding data, the encoder, and/or the decoder as described herein may be used for transmitting data when the bandwidth of a wireless network connection is low, particularly compared to an amount of data to be transmitted.

In some embodiments, the methods of encoding data, the methods of decoding data, the encoder, and/or the decoder as described herein may be part of a codec and/or integrated into a codec, e.g., with encoder as the encoder of the codec and/or with the decoder as the decoder of the codec. The codec may support one or more data types, including, for example, image, video, and audio.

Example Technical Benefits

In some examples, the methods of encoding data, the methods of decoding data, the encoder, and/or the decoder as described herein may enable transmission of encoded data that occupies less memory and/or storage than the original data and may enable realistic decoding of that encoded data.

In some examples, the methods of encoding data, the methods of decoding data, the encoder, and/or the decoder as described herein may have the potential to facilitate sending data more quickly. For example, a computing device may encode and transmit the data such that the encoded data occupies less memory than the original data, and another computing device may receive the encoded data and generate output data representative of the original data. Because the transmitted data from the computing device to the other computing device occupies less memory than the original data, the compressed data may be transmitted more quickly.

In some examples, the methods of encoding data, the methods of decoding data, the encoder, and/or the decoder as described herein may have the potential to facilitate decreasing the amount of bandwidth used when transmitting data. The transmitted encoded data from a computing device to another computing device may occupy less memory than the original data, thereby causing the compressed data to occupy less bandwidth than the original, non-encoded data.

In some examples, the methods of encoding data, the methods of decoding data, the encoder, and/or the decoder as described herein may facilitate more realistic reconstructed content. For example, the methods of decoding data described herein may reconstruct the original content such that any loss of information may be unnoticed or unperceivable to a person reviewing the content.

In some examples, the methods of encoding data, the methods of decoding data, the encoder, and/or the decoder as described herein may use only one unconditionally trained generative model. Rather than using an encoder transform, a decoder transform, an entropy model, and potentially additional models to define the training loss, the methods described herein may only use a single model for entropy coding and decoding (e.g., encoding and decoding).

In some examples, the methods of encoding data, the methods of decoding data, the encoder, and/or the decoder as described herein may facilitate communicating and/or receiving data at various bit-rates. For example, the process of encoding and/or decoding the data at a certain bit-rate may use the same machine learning model and/or follow the same general steps (perhaps with repeating one or more steps) as the process of encoding and/or decoding the data at another bit-rate.

In some examples, the methods of encoding data, the methods of decoding data, the encoder, and/or the decoder as described herein may facilitate decoding data from an incomplete bit-stream.

We consider a novel lossy compression approach based on unconditional diffusion generative models, which we call DiffC. Unlike modern compression schemes which rely on transform coding and quantization to restrict the transmitted information, DiffC relies on the efficient communication of pixels corrupted by Gaussian noise. We implement a proof of concept and find that it works surprisingly well despite the lack of an encoder transform, outperforming the state-of-the-art generative compression method HiFiC on ImageNet 64×64. DiffC only uses a single model to encode and denoise corrupted pixels at arbitrary bitrates. The approach further provides support for progressive coding, that is, decoding from partial bit streams. We perform a rate-distortion analysis to gain a deeper understanding of its performance, providing analytical results for multivariate Gaussian data as well as theoretic bounds for general distributions. Furthermore, we prove that a flow-based reconstruction achieves a 3 dB gain over ancestral sampling at high bitrates.

Introduction

We are interested in the problem of lossy compression with perfect realism. As in typical lossy compression applications, our goal is to communicate data using as few bits as possible while simultaneously introducing as little distortion as possible. However, we additionally require that reconstructions $\hat{X}$ have (approximately) the same marginal distribution as the data, $\hat{X} \sim X$. When this constraint is met, reconstructions are indistinguishable from real data or, in other words, appear perfectly realistic. Lossy compression with realism constraints is receiving increasing attention as more powerful generative models bring a solution ever closer within reach. Theoretical arguments and empirical results suggest that generative compression approaches have the potential to achieve significantly lower bitrates at similar perceived quality than approaches targeting distortions alone.

The basic idea behind existing generative compression approaches is to replace the decoder with a conditional generative model and to sample reconstructions. Diffusion models—also known as score-based generative models—are a class of generative models which have recently received a lot of attention for their ability to generate realistic images. While generative compression work has mostly relied on generative adversarial networks, there has been evidence provided that this approach may also work well with diffusion models by using conditional diffusion models for JPEG artefact removal.

Here, a novel lossy compression approach based on diffusion models is described. Unlike typical generative compression approaches, this approach relies on an unconditionally trained generative model. Modern lossy compression schemes comprise at least an encoder transform, a decoder transform, and an entropy model, whereas our approach only uses a single model. Surprisingly, it was found that this simple approach can work well despite lacking an encoder transform instead, we add isotropic Gaussian noise directly to the pixels. By using varying degrees of Gaussian noise, the same model can further be used to communicate data at arbitrary bitrates. The approach is naturally progressive, that is, reconstructions can be generated from an incomplete bitstream.

To better understand why the approach works well, a rate-distortion analysis is performed, finding that isotropic Gaussian noise is generally not optimal even for the case of Gaussian distributed data and mean-squared error (MSE) distortion. However, it is also observed that isotropic noise is close to optimal. A reconstruction is also proven based on the probability flow ODE cuts the distortion in half at high bit-rates when compared to ancestral sampling from the diffusion model.

We will use capital letters such as X to denote random variables, lower-case letters such as x to denote corresponding instances and non-bold letters such as $x_i$ for scalars. We reserve log for the logarithm to base 2 and will use ln for the natural logarithm.

Related Work

Many previous papers observed connections between variational autoencoders and rate-distortion optimization. There have been approaches where a VAE into a practical lossy compression scheme by using dithered quantization to communicate uniform samples. Similarly, our scheme relies on random coding to communicate Gaussian samples and uses diffusion models, which can be viewed as hierarchical VAEs with a fixed encoder.

Others have considered the rate-distortion performance of an idealized but closely related compression scheme based on diffusion models. In contrast to this approach, we are considering distortion under a perfect realism constraint and provide the first theoretical and empirical results demonstrating that the approach works well. Importantly, random coding is known to provide little benefit and can even hurt performance when only targeting a rate-distortion trade-off. On the other hand, random codes can perform significantly better than deterministic codes when realism constraints are considered. Some have contemplated the use of minimal random coding to encode Gaussian samples. However, MRC only communicates an approximate sample. In contrast, here, schemes which communicate an exact sample are considered, allowing us to avoid issues such as error propagation. Finally, here, an upper bound is used instead of a lower bound as a proxy for the coding cost, which guarantees that our estimated rates are achievable.

While modern lossy compression schemes rely on transform coding, very early work experimented with dithered quantization applied directly to grayscale pixels. It was found that dither was perceptually more pleasing than the banding artefacts caused by quantization. Similarly, Gaussian noise is applied directly to pixels but additionally use a powerful generative model for entropy coding and denoising.

Another line of work in compression explored anisotropic diffusion to denoise and inpaint missing pixels. This use of diffusion is fundamentally different from ours. Anisotropic diffusion has the effect of smoothing an individual image whereas the diffusion processes considered in this paper are increasing high spatial frequency content of individual images but have a smoothing effect on the distribution over images.

Figure 6B:
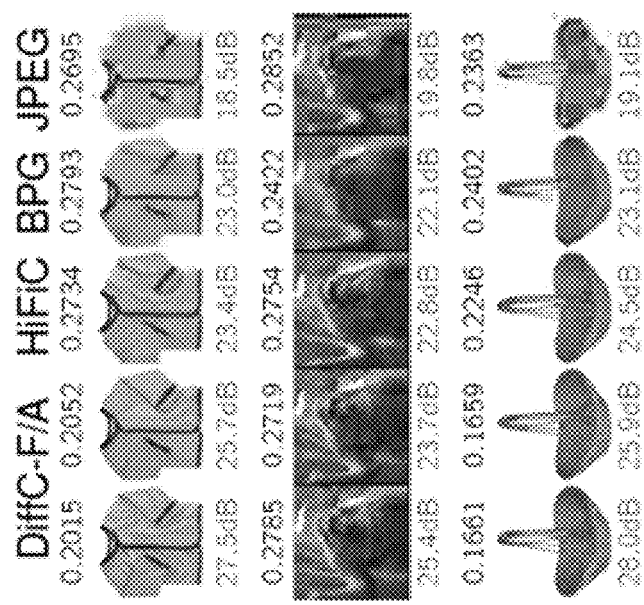
FIG. 6B depicts bitrates and PSNR scores of various approaches, in accordance with example embodiments.
Figure 6A:
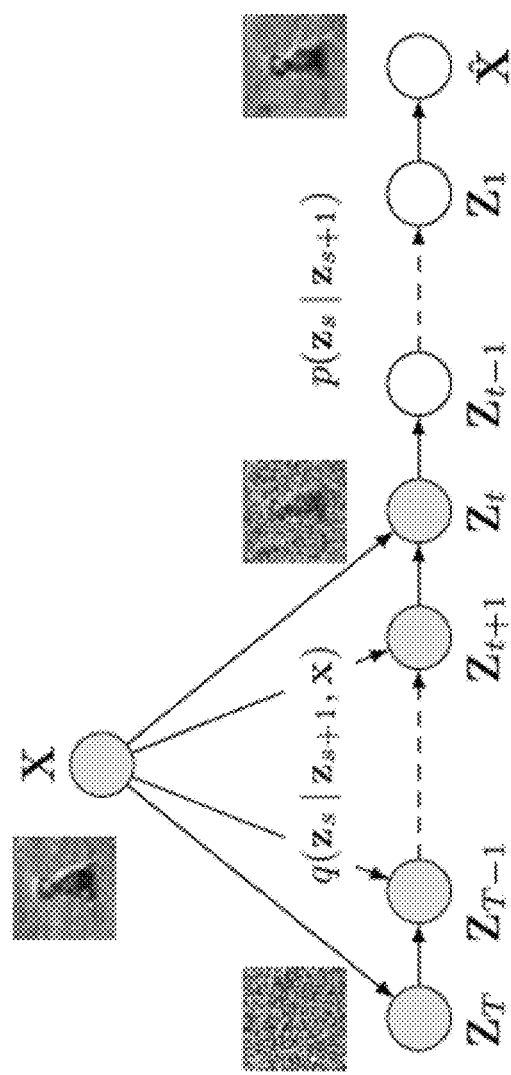
FIG. 6A is a visualization of lossy compression with unconditional diffusion models, in accordance with example embodiments.

FIG. 6A is a visualization of lossy compression with unconditional diffusion models. FIG. 6B depicts bitrates (bits per pixel; black) and PSNR scores (red) of various approaches including JPEG (4:2:0, headerless) applied to images from the validation set of ImageNet 64×64.

It was claimed that under a perfect realism constraint, the best achievable rate is R(D/2), where R is the rate-distortion function. It was further claimed that optimal performance can be achieved by optimizing an encoder for distortion alone while ignoring the realism constraint and using ancestral sampling at the decoder. Contrary to these claims, here, it is shown that the approach disclosed herein can exceed this performance and achieve up to 3 dB better signal-to-noise ratio at the same rate. The discrepancy can be explained by previous works only considering deterministic codes whereas here, random codes are allowed with access to shared randomness. In random codes, the communicated bits not only depend on the data but are a function of the data and an additional source of randomness shared between the encoder and the decoder (typically implemented by a pseudo-random number generator). These results are in line with other findings who showed on a toy example that shared randomness can lead to significantly better performance in the one-shot setting, and other findings who studied the rate-distortion-perception function of normal distributions. In this paper, additional results are provided for the multivariate Gaussian case.

An increasing number of neural compression approaches is targeting realism. However, virtually all of these approaches rely on transform coding combined with distortions based on VGG and adversarial losses. In contrast, single unconditionally trained diffusion model is used here. Unconditional diffusion models have been used for lossless compression with the help of bits-back coding but bits-back coding by itself is unsuitable for lossy compression. Here, it is shown that significant bitrate savings can be achieved compared to lossless compression even by allowing imperceptible distortions.

Lossy Compression with Diffusion

The basic idea behind the compression approach disclosed herein is to efficiently communicate a corrupted version of the data, $$Z_t = \sqrt{1-\sigma_t^2} X + \sigma_t U \text{ where } U \sim N(0, I), \quad (1)$$

from the sender to the receiver, and then to use a diffusion generative model to generate a reconstruction. $Z_t$ can be viewed as the solution to a Gaussian diffusion process given by the stochastic differential equation (SDE)

$$dZ_t = -\tfrac{1}{2}\beta_t Z_t dt + \sqrt{\beta_t} dW_t, Z_0 = X, \text{ where } \sigma_t^2 = 1 - e^{-\int_0^t \beta_\tau d\tau} \quad (2)$$

and $W_t$ is Brownian motion. Diffusion generative models try to invert this process by learning the conditional distributions $p(z_s|z_t)$ for $s<t$. If s and t are sufficiently close, then this conditional distribution is approximately Gaussian.

Noise has a negative effect on the performance of typical compression schemes. However, it has been proved that it is possible to communicate an instance of $Z_t$ using not much more than $I[X, Z_t]$ bits. Note that this mutual information decreases as the level of noise increases. A more concrete random coding approach for communicating an exact sample of $Z_t$ has been communicated. An upper bound was provided for its coding cost, namely $$I[X, Z_t] + \log(I[X, Z_t] + 1) + 5 \quad (3)$$

bits. Notice that the second and third term become negligible when the mutual information is sufficiently large. If the sender and receiver do not have access to the true marginal of $Z_t$ but instead assume the marginal distribution to be $p_t$, the upper bound on the coding cost becomes $$C_t + \log(C_t + 1) + 5 \text{ where } C_t = \mathbb{E}_x[D_{KL}[q(z_t|X) \| p_t(z_t)]] \quad (4)$$

and q is the distribution of $Z_t$ given X, which in our case is Gaussian. In practice, the coding cost can be significantly closer to $C_t$ than the upper bound.

To follow the results herein, the reader only needs to know that an exact sample of a distribution q can be communicated with a number of bits which is at most the bound given in Eq. 4, and that this is possible even when q is continuous. The bound above is analogous to the well-known result that the cost of entropy coding can be bounded in terms of H+1, where H is a cross-entropy. However, to provide some intuition for reverse channel coding, we briefly describe the high-level idea. Candidates $Z_t^1, Z_t^2, Z_t^3, \ldots$ are generated by drawing samples from $p_t$. The encoder then selects one of the candidates with index N* in a manner similar to rejection sampling such that $Z_t^{N*} \sim q$. Since the candidates are independent of the data, they can be generated by both the sender and receiver (for example, using a pseudo-random number generator with the same random seed) and only the selected candidate's index N* needs to be communicated. The entropy of N* is bounded by Eq. 4. Further details and pseudocode are provided later.

Unfortunately, Gaussian diffusion models do not provide us with tractable marginal distributions $p_t$. Instead, they give us access to conditional distributions $p(z_s|z_{s+1})$ and assume $p_T$ is isotropic Gaussian. This suggests a scheme where an instance of $Z_T$ is first transmitted and then successively refine the information received by the sender by transmitting an instance of $Z_s$ given $Z_{s+1}$ until $Z_t$ is reached. This approach incurs an overhead for the coding cost of each conditional sample. Alternatively, a Gaussian sample can be communicated from the joint distribution $q(z_{T:t}|X)$ directly while assuming a marginal distribution $p(z_{T:t})$. This achieves a coding cost upper bounded by Eq. 4 where $$C_t = \mathbb{E}_{[D_{KL}[q(z_T|X)\|p_T(z_T)]]} + \Sigma_{s=t}^{T-1} \mathbb{E}_{[D_{KL}[q(z_s|z_{s+1},X)\|p(z_s|z_{s+1})]]}. \tag{5}$$

Reverse channel coding still poses several unsolved challenges in practice. In particular, the scheme proposed by other works is computationally expensive though progress on more efficient schemes is being made. In the following issues of computational complexity will mostly be ignored and instead the focus will be on the question of whether the approach described above is worth considering at all. After all, it is not immediately clear that adding isotropic Gaussian noise directly to the data would limit information in a useful way.

Two alternatives for reconstructing data will be considered given $Z_t$. First, ancestral sampling will be considered, $\hat{X} \sim p(x|Z_t)$, which corresponds to simulating the SDE in Eq. 2 in reverse. Second, a deterministic reconstruction will be considered which instead tries to reverse the ODE $$dz_t = (-\tfrac{1}{2}\beta_t z_t - \tfrac{1}{2}\beta_t \nabla \ln p_t(z_t))dt. \tag{6}$$

It has been shown that this "probability flow" ODE produces the same trajectory of marginal distributions $p_t$ as the Gaussian diffusion process in Eq. 2 and that it can be simulated using the same model of $\nabla \ln p_t(z_t)$. These alternatives will be considered as DiffC-A when ancestral sampling is used and DiffC-F when the flow-based reconstruction is used.

A Rate-Distortion Analysis

In this section, the performance of DiffC from a rate-distortion perspective may be understood. This will be achieved by considering the Gaussian case where optimal rate-distortion trade-offs can be computed analytically and by providing bounds on the performance in the general case. Throughout this paper, distortion will be measured in terms of squared error. For our theoretical analysis it will be assumed that the diffusion model has learned the data distribution perfectly.

The (information) rate-distortion function is given by $$R(D) = \inf_{\hat{X}} I[X, \hat{X}] \text{ subject to } \mathbb{E}[\|X-\hat{X}\|^2] \le D. \tag{7}$$

It measures the smallest achievable bitrate for a given level of distortion and decreases as D increases. Note that the bitrate given by an information rate-distortion may only be achievable asymptotically by encoding many data points jointly. To keep the discussion focused, any potential overhead incurred by one-shot coding will be ignored and mutual information will be used as a proxy for the rate achieved in practice.

The rate as defined above does not make any assumptions on the marginal distribution of the reconstructions. However, here perfect realism is demanded, that is, $\hat{X} \sim X$. To achieve this constraint, a deterministic encoder requires a higher bitrate of $R(D/2)$. As shown below, lower bitrates can be achieved using random codes as in our diffusion approach. Nevertheless, $R(D/2)$ serves as an interesting benchmark as most existing codecs use deterministic codes, that is, the bits received by the decoder are solely determined by the data.

For an M-dimensional Gaussian data source whose covariance has eigenvalues $\lambda_i$, the rate-distortion function is known to be $$R^*(D) = \tfrac{1}{2}\Sigma_i \log(\lambda_i/D_i) \text{ where } D_i = \min(\lambda_i, \theta) \tag{8}$$

for some threshold $\theta$ chosen such that $D = \Sigma_i D_i$. For sufficiently small distortion D and assuming positive eigenvalues, we have constant $D_i = \theta = D/M$.

Standard Normal Distribution

As a simple first example, consider a standard normal distribution $X \sim N(0,1)$. Using ancestral sampling, the reconstruction becomes $$\hat{X} = \sqrt{1-\sigma^2} Z + \sigma V \text{ where } Z = \sqrt{1-\sigma^2} X + \sigma U, \tag{9}$$

$U, V \sim \mathcal{N}(0, 1)$ and we have dropped the dependence on t to reduce clutter. The distortion and rate in this case are easily calculated to be $$D = \mathbb{E}\left[(X-\hat{X})^2\right] = 2\sigma^2, I[X, Z] = -\log \sigma = \frac{1}{2}\log\frac{2}{D} = R^*(D/2). \tag{10}$$

This matches the performance of an optimal deterministic code. However, Z already has the desired standard normal distribution and adding further noise to it did nothing to increase the realism or reduce the distortion of the reconstruction. The flow-based reconstruction instead yields $dZ_t = 0$ and $\hat{X} = Z$ (by inserting the standard normal for $p_t$ in Eq. 6), resulting in the smaller distortion $$D = \mathbb{E}[(X-\hat{X})^2] = \mathbb{E}[(X-Z)^2] = 2 - 2\sqrt{1-\sigma^2}. \tag{11}$$

Multivariate Gaussian

Figure 7B:
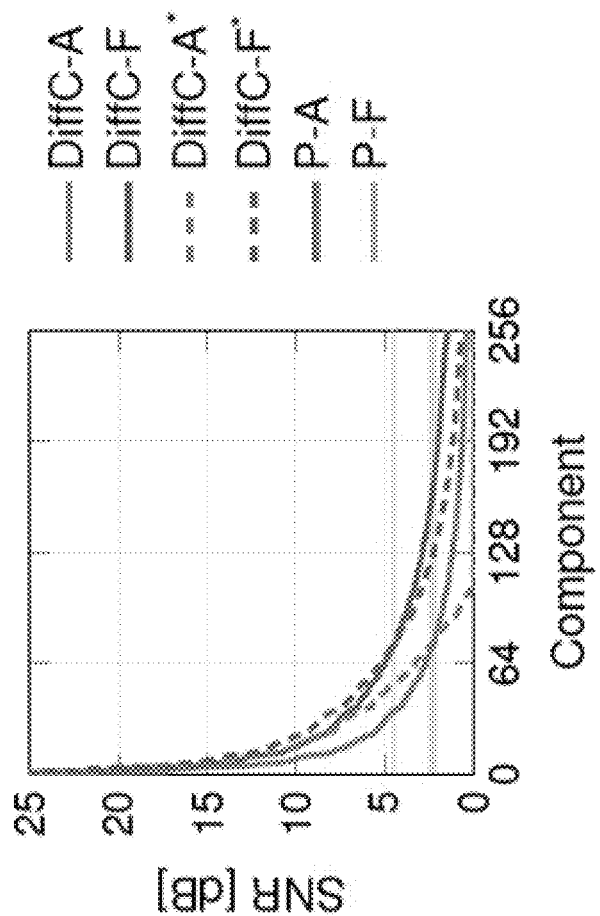
FIG. 7B depicts SNR broken down by principal component, in accordance with example embodiments.
Figure 7A:
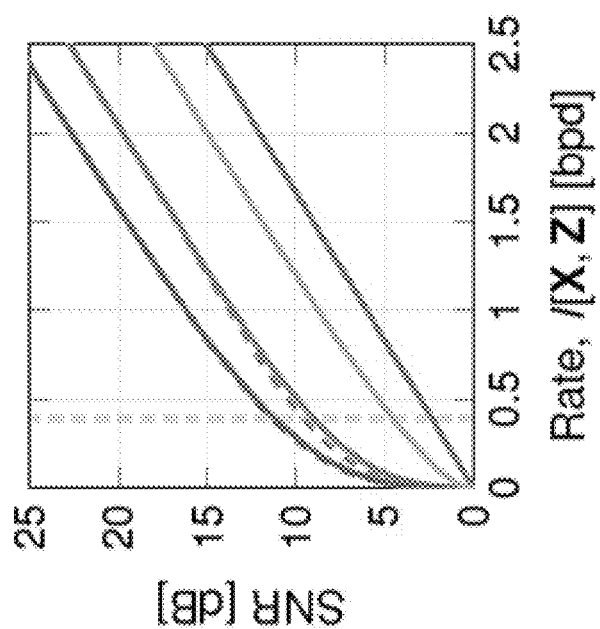
FIG. 7A depicts rate-distortion curves for a Gaussian source, in accordance with example embodiments.

FIG. 7A depicts rate-distortion curves for a Gaussian source fitted to 16×16 image patches extracted from ImageNet 64×64. Isotropic noise performs nearly as well as the optimal noise (dashed). As an additional point of comparison, we include pink noise (P) matching the covariance of the data distribution. The curve of DiffC-A* corresponds to $R^*(D/2)$. A flow-based reconstruction yields up to 3 dB better signal-to-noise ratio (SNR). FIG. 7B depicts SNR broken down by principal component. The level of noise here is fixed to yield a rate of approximately 0.391 bits per dimension for each type of noise. Note that the SNR of DiffC-A* is zero for over half of the components.

Next, $X \sim \mathcal{N}(0, \Sigma)$ and $Z = \sqrt{1-\sigma^2} X + \sigma U$ where $U \sim \mathcal{N}(0, I)$ is considered. Assume $\lambda_i$ are the eigenvalues of $\Sigma$. Since both the squared reconstruction error and the mutual information between X and Z are invariant under rotations of X, the covariance to be diagonal can be assumed. Otherwise X may be rotated to diagonalize the covariance matrix without affecting the results of the analysis. If $\hat{X} \sim P(X|Z)$, the distortion and rate is obtained.

$$D = \mathbb{E}[\|X-\hat{X}\|^2] = 2\Sigma_i \tilde{D}_i, I[X,Z] = \tfrac{1}{2}\Sigma_i \log(\lambda_i/\tilde{D}_i) \ge R^*(D/2) \tag{12}$$

where $\tilde{D}_i = \lambda_i \sigma^2/(\sigma^2 + \lambda_i - \lambda_i \sigma^2)$. That is, the performance is generally worse than the performance achieved by the best deterministic encoder. We can modify the diffusion process to improve the rate-distortion performance of ancestral sampling. Namely, let $V_i \sim \mathcal{N}(0,1)$, $$Z_i = \sqrt{1-\gamma_i^2} X_i + \gamma_i \sqrt{\lambda_i} U_i, \hat{X}_i = \sqrt{1-\gamma_i^2} Z_i + \gamma_i \sqrt{\lambda_i} V_i, \tag{13}$$

where $\gamma_i^2 = \min(1, \theta/\lambda_i)$ for some $\theta$. This amounts to using a different noise schedule along different principal directions instead of adding the same amount of noise in all directions. For natural images, the modified schedule destroys information in high-frequency components more quickly (FIG. 7B) and for Gaussian data sources again matches the performance of the best deterministic code, $$D=2\Sigma_i \lambda_i \gamma_i^2 = 2\Sigma_i D_i, I[X,Z] = -\Sigma_i \log \gamma_i = \frac{1}{2}\Sigma_i \log(\lambda_i/D_i)$$
$$= R^*(D/2) \quad (14)$$

where $D_i = \lambda_i \gamma_i^2 = \min(\lambda_i, \theta)$. Still better performance can be achieved via flow-based reconstruction. Here, isotropic noise is again suboptimal and the optimal noise for a flow-based reconstruction is given later.

$$Z_i = \alpha_i X_i + \sqrt{1-\alpha_i^2}\sqrt{\lambda_i}U_i, \text{ where } \alpha_i = (\sqrt{\lambda_i^2 + \theta^2} - \theta)/\lambda_i \quad (15)$$

for some $\theta \geq 0$. Z already has the desired distribution and we can set $\hat{X} = Z$.

Here, two approaches using optimized noise are referred to as DiffC-A* and DiffC-F*, respectively, though strictly speaking these types of noise may no longer correspond to diffusion processes. FIG. 7A shows the rate-distortion performance of the various noise schedules and reconstructions on the example of a 256-dimensional Gaussian fitted to 16×16 grayscale image patches extracted from 64×64 downsampled ImageNet images. Here, SNR=10 $\log_{10}(2 \cdot \mathbb{E}[\|X\|]) - 10 \log_{10}(\mathbb{E}[\|X-\hat{X}\|^2])$.

General Data Distributions

Considering more general source distributions, the first result bounds the rate of DiffC-A*.

Theorem 1. Let X: $\Omega \to \mathbb{R}^M$ be a random variable with finite differential entropy, zero mean and covariance diag($\lambda_1, \ldots, \lambda_M$). Let $U \sim \mathcal{N}(0, I)$ and define $$Z_i = \sqrt{1-\gamma_i^2}X_i + \gamma_i \sqrt{\lambda_i}U_i, \hat{X} \sim P(X|Z). \quad (16)$$

where $\gamma_i^2 = \min(1, \theta/\lambda_i)$ for some $\theta$.

Further, let X* be a Gaussian random variable with the same first and second-order moments as X and let Z* be defined analogously to Z but in terms of X*. Then if R is the rate-distortion function of X and R* is the rate-distortion function of X*, $$I[X,Z] \leq R^*(D/2) - D_{KL}[P_Z \| P_{Z^*}] \leq R(D/2) + D_{KL}[P_X \| P_{X^*}] - D_{KL}[P_Z \| P_{Z^*}] \quad (17)$$

where $D = \mathbb{E}[\|X-\hat{X}\|^2]$.

In line with expectations, this result implies that when X is approximately Gaussian, the rate of DiffC-A* is not far from the rate of the best deterministic encoder, R(D/2). It further implies that the rate is close to R(D/2) in the high bitrate regime if the differential entropy of X is finite. This can be seen by noting that the second KL divergence will approach the first KL divergence as the rate increases, since $P_{Z^*} = P_{X^*}$ and the distribution of Z will be increasingly similar to X.

Figure 8A:
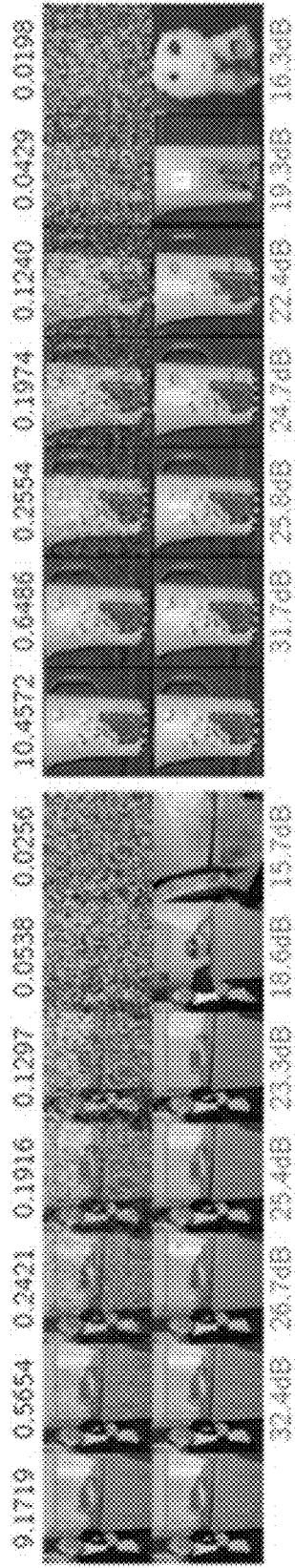
FIG. 8A depicts images visualize messages communicated at the estimated bitrate, in accordance with example embodiments.

FIG. 8A depicts images visualize messages communicated at the estimated bitrate (bits per pixel).

Figure 8B:
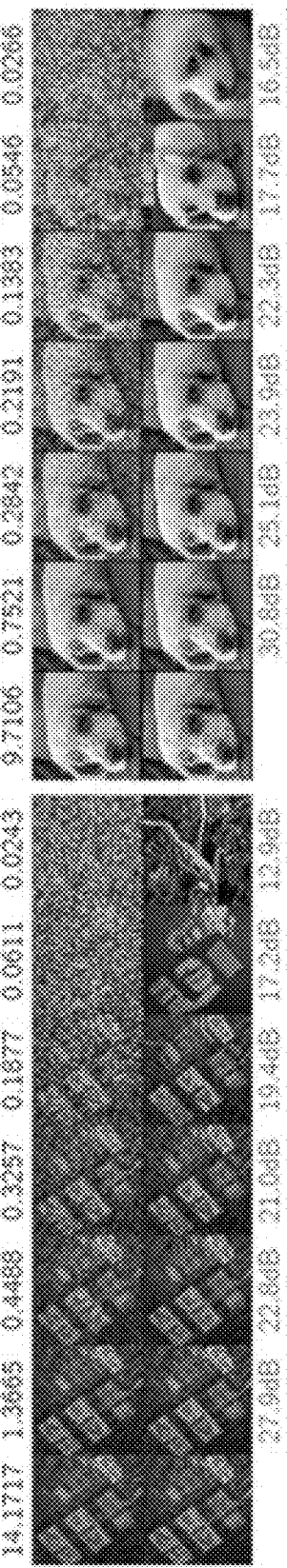
FIG. 8B depicts reconstructions produced by DiffC-F and corresponding PSNR values, in accordance with example embodiments.

FIG. 8B depicts reconstructions produced by DiffC-F and corresponding PSNR values.

The next result compares the error of DiffC-F with DiffC-A's at the same bitrate. For simplicity, it is assumed that X has a smooth density and further consider the following measure of smoothness, $$G = \mathbb{E}[\|\nabla \ln p(X)\|^2]. \quad (18)$$

Among distributions with a continuously differentiable density and unit variance, the standard normal distribution minimizes G and achieves G=1. For comparison, the Laplace distribution has G=2. (Alternatively, imagine a sequence of smooth approximations converging to the Laplace density.) For discrete data such as RGB images, the distribution of pixels with an imperceptible amount of Gaussian noise added to it may instead be considered.

Theorem 2. Let X: $\Omega \to \mathbb{R}^M$ have a smooth density p with finite G (Eq. 18). Let $Z_t$ be defined as in Eq. 1, $\hat{X}_A \sim P(X|Z_t)$ and let $\hat{X}_F = \hat{Z}_0$ be the solution to Eq. 6 with $Z_t$ as initial condition. Then $$\lim_{\sigma_t \to 0} \frac{\mathbb{E}[\|\hat{X}_F - X\|^2]}{\mathbb{E}[\|\hat{X}_A - X\|^2]} = \frac{1}{2} \quad (19)$$

This result implies that in the limit of high bitrates, the error of a flow-based reconstruction is only half that of the the reconstruction obtained with ancestral sampling from a perfect model. This is consistent with FIG. 7A-7B, where an advantage of roughly 3 dB of DiffC-F over DiffC-A can be observed. Finally, it is provided that conditions under which a flow-based reconstruction is probably the best reconstruction from input corrupted by Gaussian noise.

Theorem 3. Let X=QS where Q is an orthogonal matrix and S: $\Omega \to \mathbb{R}^M$ is a random vector with smooth density and $S_i \perp\!\!\!\perp S_j$ for all $i \neq j$. Define $Z_t$ as in Eq. 1. If $\hat{X}_F = \hat{Z}_0$ is the solution to the ODE in Eq. 6 given $Z_t$ as initial condition, then $$\mathbb{E}[\|\hat{X}_F - X\|^2] \leq \mathbb{E}[\|\hat{X}' - X\|^2] \quad (20)$$

for any with $\hat{X}'$ with $\hat{X}' \perp\!\!\!\perp X | Z_t$ which achieves perfect realism, $\hat{X}' \sim X$.

Experiments

As a proof of concept, DiffC is implemented based on VDM. VDM is a diffusion model which was optimized for log-likelihood (i.e., lossless compression) but not for perceptual quality. This suggests VDM should work well in the high bitrate regime but not necessarily at lower bitrates. Nevertheless, it is found that surprisingly good performance can be achieved across a wide range of bitrates.

Dataset, Metrics, and Baselines

The downsampled version of the ImageNet dataset (64×64 pixels) was used. The test set of ImageNet is known to contain many duplicates and to overlap with the training set. For a more meaningful evaluation (especially when comparing to non-neural baselines), we removed 4952 duplicates from the validation set as well as 744 images also occurring in the training set (based on SHA-256 hashes of the images). On this subset, we measured a negative ELBO of 3.48 bits per dimension for our model.

FID and PSNR scores are reported herein to quantify the performance of the different approaches. As is common in the compression literature, in this section a PSNR score is calculated for each image before averaging. For easier comparison with our theoretical results, PSNR scores calculated from the average MSE are also calculated although the numbers do not change markedly. When comparing bitrates between models, we used estimates of the upper bound given by Eq. 4 for DiffC.

Figure 9:
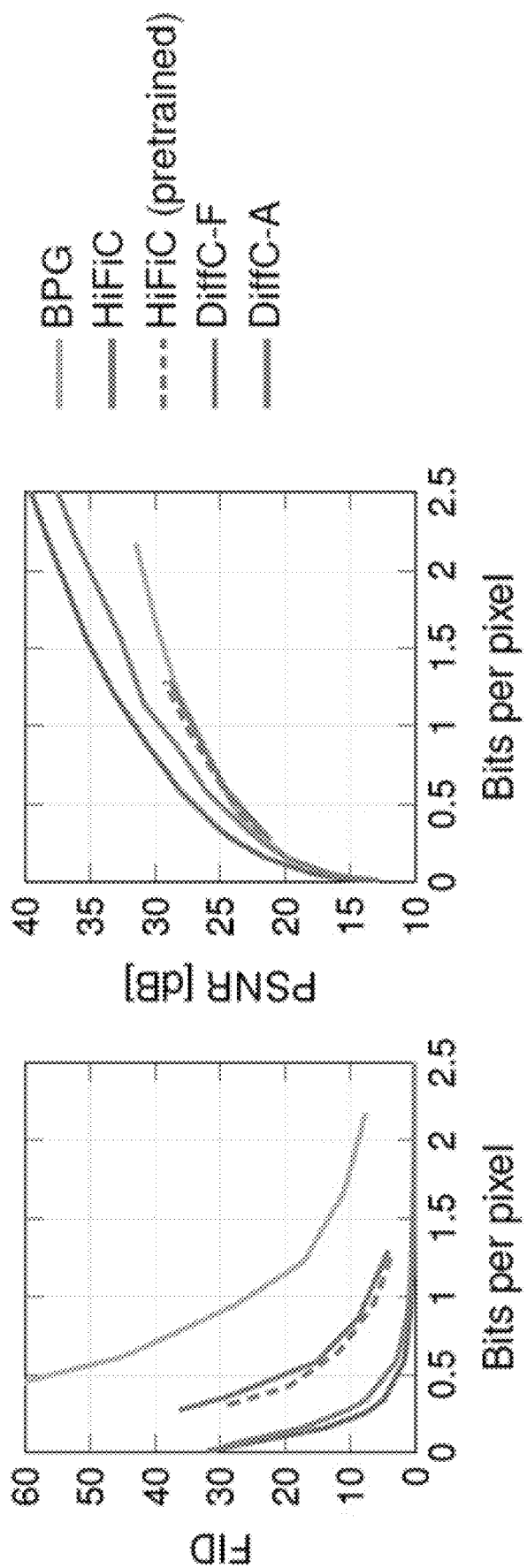
FIG. 9 depicts a comparison of DiffC with BPG and the GAN-based neural compression method HiFiC, in accordance with example embodiments.

FIG. 9 depicts a comparison of DiffC with BPG and the GAN-based neural compression method HiFiC in terms of FID and PSNR on ImageNet 64×64.

BPG is used as a comparison. BPG is a strong non-neural image codec based on the HEVC video codec which is known for achieving good rate-distortion results. HiFiC is also used as a comparison. HiFiC is the state-of-the-art generative image compression model in terms of visual quality on high-resolution images. The approach is optimized for a combination of LPIPS, MSE, and an adversarial loss. The architecture of HiFiC is optimized for larger images and uses significant downscaling. It is found that adapting the architecture of HiFiC slightly by making the last/first layer of the encoder/decoder have stride 1 instead of stride 2 improves FID on ImageNet 64×64 compared to the publicly available model. In addition to training the model from scratch, initializing the non-adapted filters from the public model was also attempted and it was found that this improved results slightly. Five HiFiC models were trained targeting five different bitrates.

Results

It is found that DiffC-F gives perceptually pleasing results even at extremely low bitrates of around 0.2 bits per pixel (FIG. 8A-8B). Reconstructions are also still perceptually pleasing when the PSNR is relatively low at around 22 dB (e.g., compare to BPG in FIG. 6B). We further find that at very low bitrates, HiFiC produces artefacts typical for GANs while we did not observe similar artefacts with DiffC. Similar conclusions can be drawn from the quantitative comparison, with DiffC-F significantly outperforming HiFiC in terms of FID. FID scores of DiffC-A were only slightly worse (FIG. 9).

At high bitrates, DiffC-F achieves a PSNR roughly 2.4 dB higher than DiffC-A. This is line with our theoretical predictions (3 dB) considering that the diffusion model only approximates the true distribution. PSNR values of DiffC-F and DiffC-A both exceed those of HiFiC and BPG, suggesting that Gaussian diffusion works well in a rate-distortion sense even for highly non-Gaussian distributions (FIG. 4B). Additional results are provided later, including results for progressive coding and HiFiC trained for MSE only.

Discussion

A new lossy compression approach is presented and analyzed based on diffusion models. This approach has the potential to greatly simplify lossy compression with realism constraints. Where typical generative approaches use an encoder, a decoder, an entropy model, an adversarial model and another model as part of a perceptual distortion loss, and train multiple sets of models targeting different bitrates, DiffC only uses a single unconditionally trained diffusion model. The fact that adding Gaussian noise to pixels achieves great rate-distortion performance raises interesting questions about the role of the encoder transform in lossy compression. Nevertheless, further improvements may be possible in terms of perceptual quality by applying DiffC in a latent space.

Applying DiffC in a lower-dimensional transform space would also help to reduce its computational cost. The high computational cost of DiffC makes it impractical in its current form. Generating a single image with VDM requires many diffusion steps, each involving the application of a deep neural network. However, speeding up diffusion models is a highly active area of research. For example, one group was able to reduce the number of diffusion steps from 1000 to around 4 at comparable sample quality. The computational cost of communicating a sample using the approach of another group grows exponentially with the coding cost. However, reverse channel coding is another active area of research and much faster methods already exist for low-dimensional Gaussian distributions.

Figure 10:
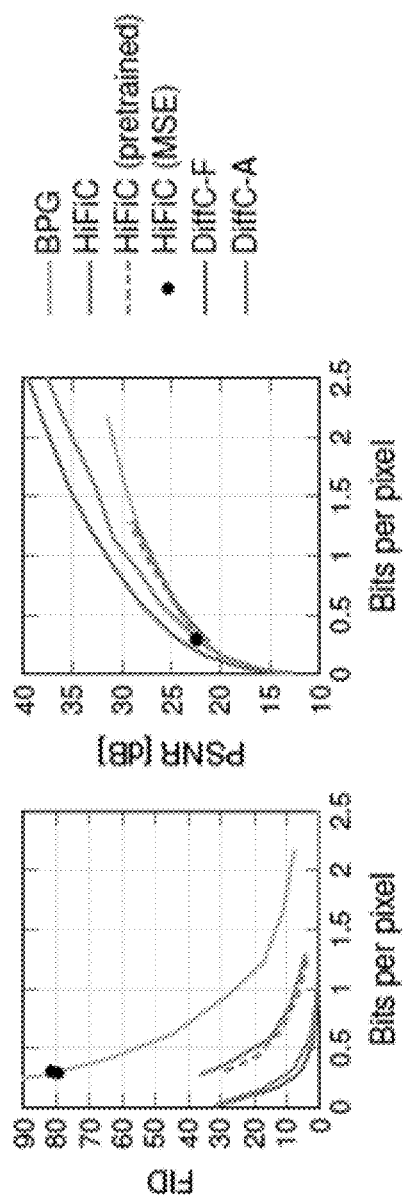
FIG. 10 depicts results for HiFiC trained from scratch for MSE, in accordance with example embodiments.

Reverse channel coding may be applied after each diffusion step to send a sample of $q(z_t|Z_{t+1}, X)$, or alternatively to the joint distribution $q(z_{T:t}|X)$. The former approach has the advantage of lower computational cost due to the exponential growth with the coding cost. Furthermore, the model's score function only needs to be evaluated once per diffusion step to compute a conditional mean while the latter approach requires many more evaluations (one for each candidate considered by the reverse channel coding scheme). FIG. 10 shows that this approach—which is already much more practical—still significantly outperforms HiFiC. In particular, FIG. 10 depicts results for HiFiC trained from scratch for MSE only, targeting a single bitrate. The PSNR improves slightly while the FID score gets significantly worse. Another interesting avenue to consider is replacing Gaussian $q(z_t|Z_{t+1}, X)$ with a uniform distribution, which can be simulated very efficiently.

An initial theoretical analysis of DiffC is provided. In particular, the Gaussian case is analyzed and it is proved herein that DiffC-A* performs well when either the data distribution is close to Gaussian or when the bitrate is high. In particular, the rate of DiffC-A* approaches R(D/2) at high birates. It is further proved herein that DiffC-F can achieve 3 dB better SNR at high bitrates compared to DiffC-A. Taken together, these results suggest that R(D) may be achievable at high bitrates where current approaches based on nonlinear transform coding can only achieve R(D/2).

CONCLUSION

The present disclosure is not to be limited in terms of the particular embodiments described in this application, which are intended as illustrations of various aspects. Many modifications and variations can be made without departing from its scope, as will be apparent to those skilled in the art. Functionally equivalent methods and apparatuses within the scope of the disclosure, in addition to those described herein, will be apparent to those skilled in the art from the foregoing descriptions. Such modifications and variations are intended to fall within the scope of the appended claims.

The above detailed description describes various features and operations of the disclosed systems, devices, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the scope of the subject matter presented herein. It will be readily understood that the aspects of the present disclosure, as generally described herein, and illustrated in the figures, can be arranged, substituted, combined, separated, and designed in a wide variety of different configurations.

With respect to any or all of the message flow diagrams, scenarios, and flow charts in the figures and as discussed herein, each step, block, and/or communication can represent a processing of information and/or a transmission of information in accordance with example embodiments. Alternative embodiments are included within the scope of these example embodiments. In these alternative embodiments, for example, operations described as steps, blocks, transmissions, communications, requests, responses, and/or messages can be executed out of order from that shown or discussed, including substantially concurrently or in reverse order, depending on the functionality involved. Further, more or fewer blocks and/or operations can be used with any of the message flow diagrams, scenarios, and flow charts discussed herein, and these message flow diagrams, scenarios, and flow charts can be combined with one another, in part or in whole.

A step or block that represents a processing of information may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical operations or actions in the method or technique. The program code and/or related data may be stored on any type of computer readable medium such as a storage device including random access memory (RAM), a disk drive, a solid state drive, or another storage medium.

The computer readable medium may also include non-transitory computer readable media such as computer readable media that store data for short periods of time like register memory, processor cache, and RAM. The computer readable media may also include non-transitory computer readable media that store program code and/or data for longer periods of time. Thus, the computer readable media may include secondary or persistent long term storage, like read only memory (ROM), optical or magnetic disks, solid state drives, compact-disc read only memory (CDROM), for example. The computer readable media may also be any other volatile or non-volatile storage systems. A computer readable medium may be considered a computer readable storage medium, for example, or a tangible storage device.

Moreover, a step or block that represents one or more information transmissions may correspond to information transmissions between software and/or hardware modules in the same physical device. However, other information transmissions may be between software modules and/or hardware modules in different physical devices. The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for the purpose of illustration and are not intended to be limiting, with the true scope being indicated by the following claims.

What is claimed:

1. A method of encoding data comprising:
   determining, by an encoder, a first data instance by corrupting the data with Gaussian noise;
   determining, by the encoder, information representative of one or more conditional distributions, wherein the one or more conditional distributions are between sequential data instances in a sequence of progressively less corrupted data instances starting from the first data instance;
   determining, by the encoder, an index of a corrupted data instance of the sequence of progressively less corrupted data instances, wherein the index corresponds with a conditional distribution of the one or more conditional distributions which causes the corrupted data instance to have a desired bit-rate; and
   transmitting, from the encoder to a decoder, the first data instance and the information representative of the one or more conditional distributions to enable the decoder to recover the corrupted data instance having the desired bitrate and use the corrupted data instance to generate output data representative of the data.

2. The method of claim 1, wherein the data is an image, an audio segment, or a video segment.

3. The method of claim 1, wherein the first data instance occupies less storage than the data.

4. The method of claim 1, wherein the corrupted data instance with the desired bit-rate occupies less storage than the data and occupies more storage than the first data instance.

5. The method of claim 1, further comprising determining the desired bit-rate based on the corrupted data instance occupying a desired storage amount.

6. The method of claim 1, further comprising:
   determining a desired bit-rate from a series of bit-rates, wherein the series of bit-rates comprises a high bit-rate and a low bit-rate, wherein a corrupted data instance having a high bit-rate occupies a higher data storage amount than a corrupted data instance having a low bit-rate, wherein the output data generated from the corrupted data instance having the high bit-rate is more representative of the data than output data generated from the corrupted data instance having the low bit-rate.

7. The method of claim 1, wherein determining the first data instance by corrupting the data with Gaussian noise comprises:
   determining a plurality of Gaussian noise values, wherein the Gaussian noise values are distributed normally; and
   adding the plurality of Gaussian noise values to the data.

8. The method of claim 1, wherein the encoder is run on a server device and the decoder is run on a mobile device, wherein transmitting the first data instance and the information representative of the one or more conditional distributions further enables the server device to transmit to the mobile device a representation of the data that occupies less storage than the data.

9. The method of claim 1, wherein the sequence of progressively less corrupted data instances comprises the first data instance and a second data instance, wherein the second data instance depends on the first data instance.

10. The method of claim 9, wherein the information representative of the one or more conditional distributions comprises information representative of a first conditional distribution, wherein the second data instance is the first data instance given the information representative of the first conditional distribution.

11. The method of claim 1, further comprising:
    receiving a request to transmit a representation of the data, wherein determining the first data instance is in response to receiving the request.

12. The method of claim 1, wherein transmitting, from the encoder to the decoder, the first data instance and the information representative of the one or more conditional distributions comprises: transmitting information representative of each of the one or more conditional distributions using one or more separate messages at one or more different points in time.

13. The method of claim 1, wherein transmitting, from the encoder to the decoder, the first data instance and the information representative of the one or more conditional distributions comprises: transmitting information representative of each of the one or more conditional distributions using a single message at a single point in time.

14. A method of decoding data comprising:
    receiving, by a decoder from an encoder, a first data instance and information representative of one or more conditional distributions, wherein the information representative of the one or more conditional distributions are between sequential data instances in a sequence of progressively less corrupted data instances starting from the first data instance;

determining, by the decoder and based on the first data instance and the information representative of the one or more conditional distributions, a corrupted data instance of the sequence of progressively less corrupted data instances, wherein the corrupted data instance has a desired bit-rate; and generating, by the decoder based on the corrupted data instance, output data representative of the data, wherein the output data is one of one or more predicted data instances generated sequentially starting from the corrupted data instance.

15. The method of claim 14, further comprising:
determining, based on the first data instance and information representative of a conditional distribution between the first data instance and a second data instance of the sequential data instances, the second data instance in the sequence of progressively less corrupted data instances.

16. The method of claim 15, further comprising:
determining, based on the second data instance and information representative of a conditional distribution between the second data instance and a third data instance of the sequential data instances, the third data instance in the sequence of progressively less corrupted data instances.

17. The method of claim 14, wherein generating, by the decoder based on the corrupted data instance, output data representative of the data comprises:
inputting the corrupted data instance into a diffusion generative model to obtain a first predicted data instance of the one or more predicted data instances.

18. The method of claim 17, wherein generating, by the decoder based on the corrupted data instance, output data representative of the data further comprises:
inputting the first predicted data instance into the diffusion generative model to obtain a second predicted data instance of the one or more predicted data instances.

19. The method of claim 14, wherein the first data instance occupies less storage than the corrupted data instance of the sequence of progressively less corrupted data instances.

20. A non-transitory computer-readable medium having stored thereon instructions that, when executed by a computing device, cause the computing device to perform operations comprising:
determining, by an encoder, a first data instance by corrupting the data with Gaussian noise;
determining, by the encoder, information representative of one or more conditional distributions, wherein the one or more conditional distributions are between sequential data instances in a sequence of progressively less corrupted data instances starting from the first data instance;
determining, by the encoder, an index of a corrupted data instance of the sequence of progressively less corrupted data instances, wherein the index corresponds with a conditional distribution of the one or more conditional distributions which causes the corrupted data instance to have a desired bit-rate; and
transmitting, from the encoder to a decoder, the first data instance and the information representative of the one or more conditional distributions to enable the decoder to recover the corrupted data instance having the desired bitrate and use the corrupted data instance to generate output data representative of the data.

* * * * *